US011854762B1

(12) United States Patent
Fang et al.

(10) Patent No.: US 11,854,762 B1
(45) Date of Patent: Dec. 26, 2023

(54) MEMS SAMPLE HOLDER, PACKAGED PRODUCT THEREOF, AND APPARATUS OF CHARGED-PARTICLE BEAM SUCH AS ELECTRON MICROSCOPE USING THE SAME

(71) Applicant: BORRIES PTE. LTD., Singapore (SG)

(72) Inventors: Wei Fang, Saratoga, CA (US); Xiaoming Chen, Sunnyvale, CA (US); Daniel Tang, Fremont, CA (US); Liang-Fu Fan, Fremont, CA (US); Zhongwei Chen, Los Altos Hills, CA (US)

(73) Assignee: BORRIES PTE. LTD., Singapore (SG)

( * ) Notice: Subject to any disclaimer, the term of this patent is extended or adjusted under 35 U.S.C. 154(b) by 0 days.

(21) Appl. No.: 18/170,526

(22) Filed: Feb. 16, 2023

(51) Int. Cl.
*H01J 37/20* (2006.01)

(52) U.S. Cl.
CPC .................. *H01J 37/20* (2013.01)

(58) Field of Classification Search
CPC .. H01J 37/00; H01J 37/02; H01J 37/26; H01J 37/28; H01J 37/16; H01J 37/20; H01J 2237/16; H01J 2237/164; H01J 2237/166; H01J 2237/20; H01J 2237/2003; H01J 2237/2004; H01J 2237/2007

USPC ............ 250/306, 307, 311, 440.11
See application file for complete search history.

(56) References Cited

U.S. PATENT DOCUMENTS

| | | | | |
|---|---|---|---|---|
| 4,764,674 A * | 8/1988 | Kinoshita | ............ | H01J 37/285 |
| | | | | 250/397 |
| 5,406,087 A * | 4/1995 | Fujiyoshi | ............... | H01J 37/26 |
| | | | | 850/18 |
| 2008/0179518 A1 * | 7/2008 | Creemer | ................ | H01J 37/26 |
| | | | | 250/311 |
| 2011/0253908 A1 * | 10/2011 | Feng | ...................... | H01J 37/26 |
| | | | | 977/962 |
| 2012/0298883 A1 * | 11/2012 | Grogan | .................. | H01J 37/28 |
| | | | | 156/60 |

* cited by examiner

*Primary Examiner* — Jason L McCormack
(74) *Attorney, Agent, or Firm* — George Guosheng Wang; Upstream Research and Patent LLC

(57) ABSTRACT

The present invention provides a MEMS sample holder comprising an observation section. The observation section includes a first layer, a second layer, and a sample compartment between the first layer and the second layer. The sample compartment is configured for filling a liquid sample and observing the liquid sample filled therewithin. The sample compartment has one, two or more windows through which an electron beam can pass. Each of the windows is formed on two cavities including a first cavity on the first layer and a second cavity on the second layer that is opposite to the first cavity across the sample compartment.

18 Claims, 33 Drawing Sheets

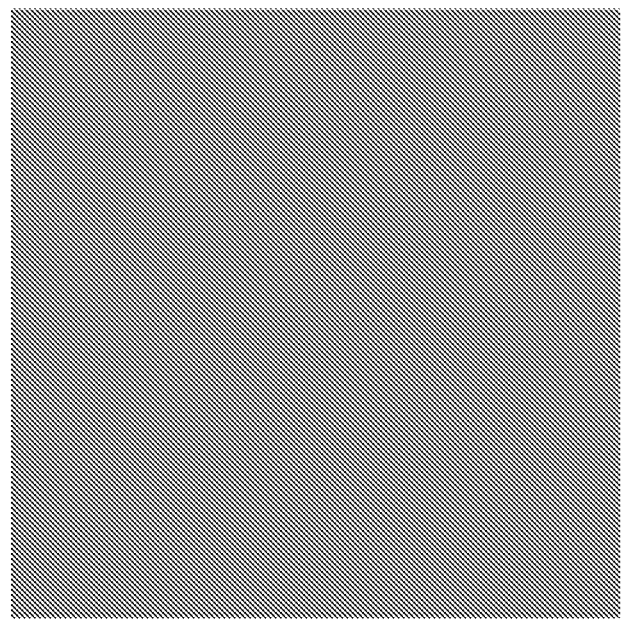
Figure 24

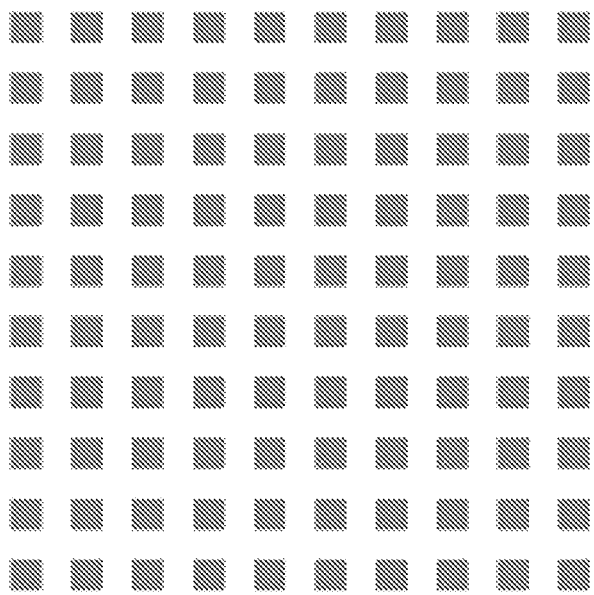
Figure 25

MEMS SAMPLE HOLDER, PACKAGED PRODUCT THEREOF, AND APPARATUS OF CHARGED-PARTICLE BEAM SUCH AS ELECTRON MICROSCOPE USING THE SAME

FIELD OF THE INVENTION

The present invention generally relates to a sample holder based on Micro Electromechanical Systems (MEMS), a packaged product thereof, and an apparatus of charged-particle beam such as an electron microscope (EM) using the packaged product.

BACKGROUND OF THE INVENTION

Since TEM technique was developed in nineteen thirties, TEM/STEM technique has been used in many areas, like medical, biology, material analysis etc. To acquire high-quality images, thin sample become very important for TEM/STEM examination. How to prepare ultrathin sample is being studied widely. Currently, dried sample based on 3 mm copper (mesh) grids is used, and some liquid samples based on thin chamber are also used.

Currently, ultrathin sections are collected on 3 mm copper (mesh) grids and stained with uranyl acetate. This sample preparation is manually operated by a trained expert. Other methods for liquid sample preparation also need operators to manually operate and seal liquid into some kits. The whole sample preparation is time-consuming and doesn't have a standard quality inspection before the TEM/STEM images are acquired. Highly-skilled operator is necessary for current TEM/STEM sample preparation. These complex sample preparation flows limit application of the current TEM/STEM in a lot of other areas.

Current sample preparation has another issue for small particle. Particle can't be separated by size during manual sample preparation. So, it is possible to introduce particles of other undesired size, causing failure of the sample preparation.

Therefore, there exists a need to overcome the aforementioned problems. Advantageously, the present invention provides a new TEM/STEM liquid sample preparation flow that doesn't need a highly-skilled operator.

SUMMARY OF THE INVENTION

One aspect of the present invention provides a MEMS sample holder comprising an observation section. The observation section includes a first layer, a second layer, and a sample compartment between the first layer and the second layer. The sample compartment is configured for filling a liquid sample and observing the liquid sample filled therewithin. The sample compartment has one, two or more windows through which an electron beam can pass. Each of the windows is formed on two cavities including a first cavity on the first layer and a second cavity on the second layer that is opposite to the first cavity across the sample compartment.

Another aspect of the invention provides a packaged MEMS device including the MEMS sample holder as described above; and glass members coated with a metal layer. For example, the packaged MEMS sample holder has a size of 10×20 mm.

Still another aspect of the invention provides an apparatus of charged-particle beam such as an electron microscope (EM) comprising the packaged MEMS device as described above.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form, omitted, or merely suggested, in order to avoid unnecessarily obscuring the present invention.

FIG. 24 schematically illustrates a wafer substrate back side etch window for the fabrication process of a MEMS sample holder in accordance with an exemplary embodiment of the present invention.

FIG. 25 schematically illustrates wafer substrate back side etch watch window to SN layer for the fabrication process of a MEMS sample holder in accordance with an exemplary embodiment of the present invention.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

It is also to be understood that the terminology used herein is for the purpose of describing particular embodiments only, and is not intended to limit the scope of the invention. For example, when an element is referred to as being "on", "connected to", or "coupled to" another element, it can be directly on, connected or coupled to the other element or intervening elements may be present. In contrast, when an element is referred to as being "directly on", "directly connected to", or "directly coupled to" another element, there are no intervening elements present.

Throughout the specification and claims, the following terms take the meanings explicitly associated herein, unless the context clearly dictates otherwise. The phrase "in one embodiment" does not necessarily refer to the same embodiment, although it may. Furthermore, the phrase "in another embodiment" does not necessarily refer to a different embodiment, although it may. Thus, as described below, various embodiments of the invention may be readily combined without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Figure 1:
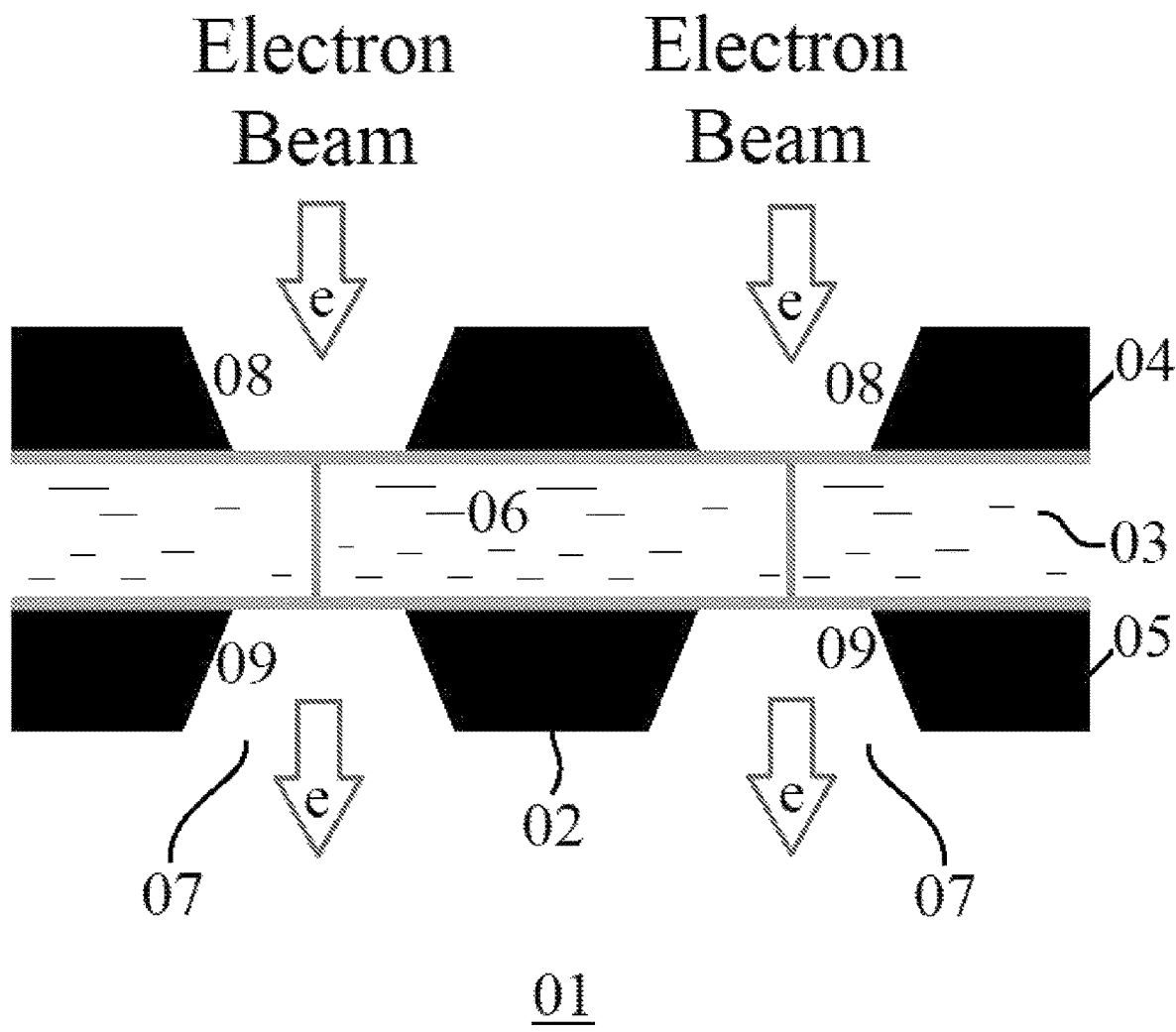
FIG. 1 schematically shows an observation section of a MEMS sample holder in accordance with an exemplary embodiment of the present invention.

As shown in FIG. 1, a MEMS sample holder 01 includes an observation section 02. A sample compartment 03 is defined between a first layer 04 and a second layer 05. The sample compartment 03 is configured for filling a liquid sample 06 and observing the liquid sample 06 filled within the compartment 03. The sample compartment 03 has one, two or more windows 07 through which an electron beam can pass. Each of the windows 07 is formed on two cavities (08, 09) including a first cavity 08 on the first layer 04 and a second cavity 09 on the second layer 05 that is opposite to the first cavity 08 across the sample compartment 03.

Figure 2:
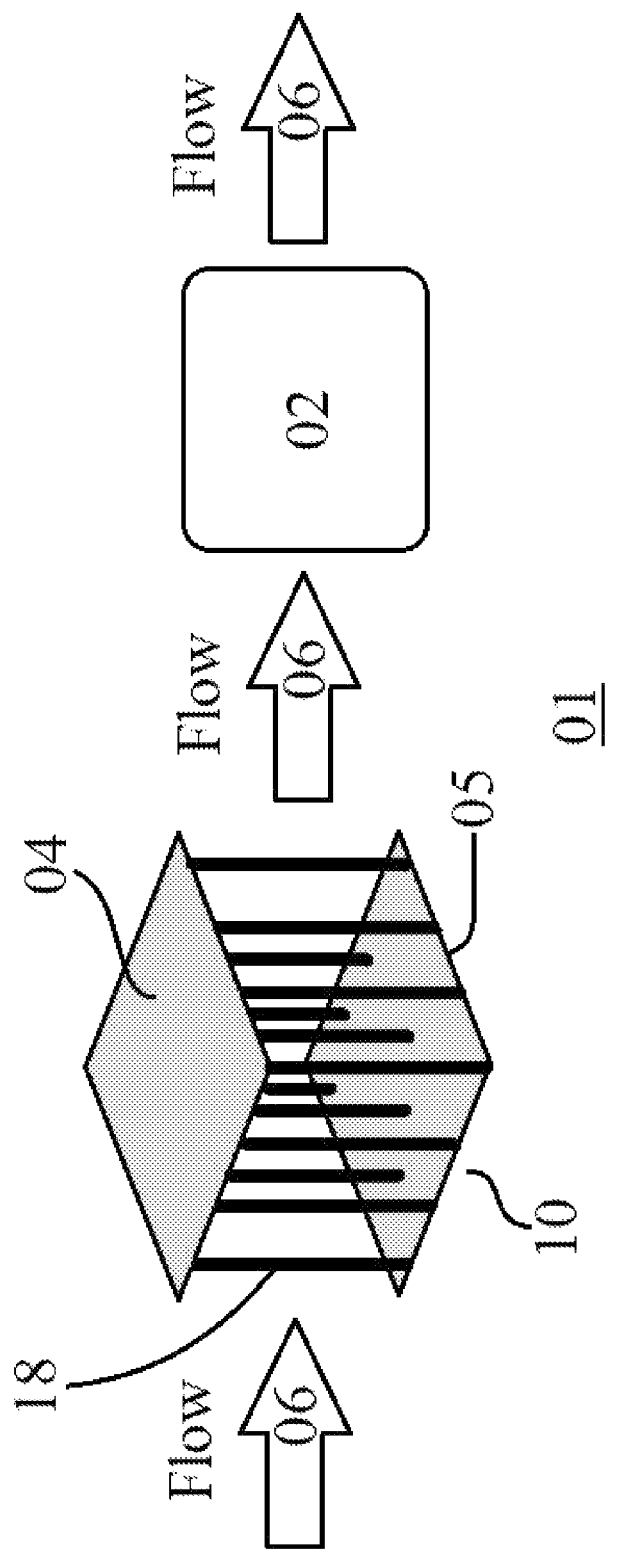
FIG. 2 schematically illustrates a filter in the upstream of an observation section in accordance with an exemplary embodiment of the present invention.

As shown in FIG. 2, a filter 10 in the upstream of the observation section 02 may be used in the MEMS sample holder 01, and it is configured for filtering the liquid sample 06 before the sample 06 flows into the sample compartment 03. In an embodiment, the filter 10 may be a filter section that is defined between the first layer 04 (or an extension thereof) and the second layer 05 (or an extension thereof). In an embodiment, the filter section 10 includes multiple pillars 18 connecting the first layer 04 and the second layer 05. Gaps between neighboring pillars 18 may function as filter mesh, holes or "eyes" allowing particles smaller than a certain size in the liquid sample 06 to pass through.

Figure 3:
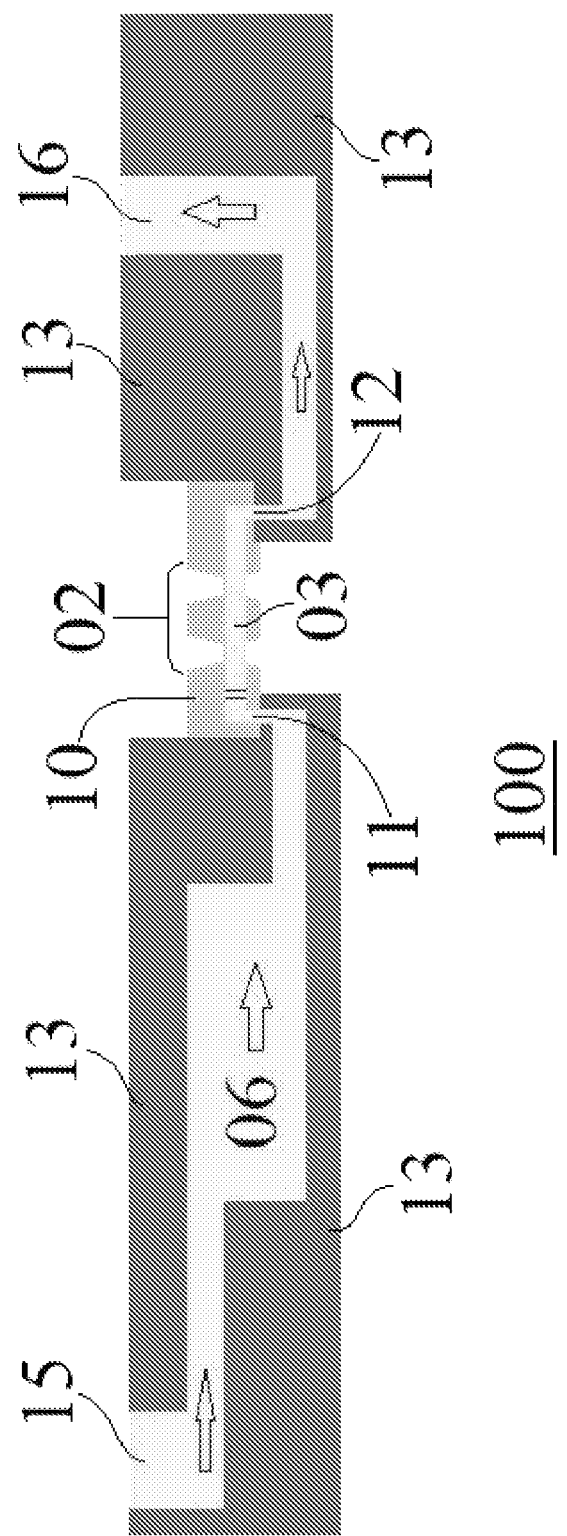
FIG. 3 illustrates the design of a packaged MEMS sample device in accordance with an exemplary embodiment of the present invention.

FIG. 3 shows a packaged MEMS device 100 including the MEMS sample holder 01 and glass member 13 coated with a metal layer (not shown). The packaged MEMS sample holder 100 may have a size of 10×20 mm. As shown in FIG. 3, the MEMS sample holder 01 further includes a sample inlet 11 and a sample outlet 12. The MEMS sample holder 01 is configured for the liquid sample 06 to flow into the sample compartment 03 through the sample inlet 11 and exit the sample compartment 03 through the sample outlet. The filter 10 is located between the sample inlet 11 and the observation section 02 and configured for filtering the liquid sample 06 before the sample 06 flows into the sample compartment 03. The channel for the liquid sample 06 is confined within the two layers (04, 05) and glass-based walls 13 that are sealed with the two layers (04, 05). There are package inlet 15 and package outlet 16 in flow communication with holder inlet 11 and holder outlet 12. The surface of the glass-based walls 13 (particularly the surface that is exposed to the electron beam) is preferably treated for suitability in an electron microscope, for example, coating the surface with a metallic material. Real channel layout may round all corners.

Figure 4:
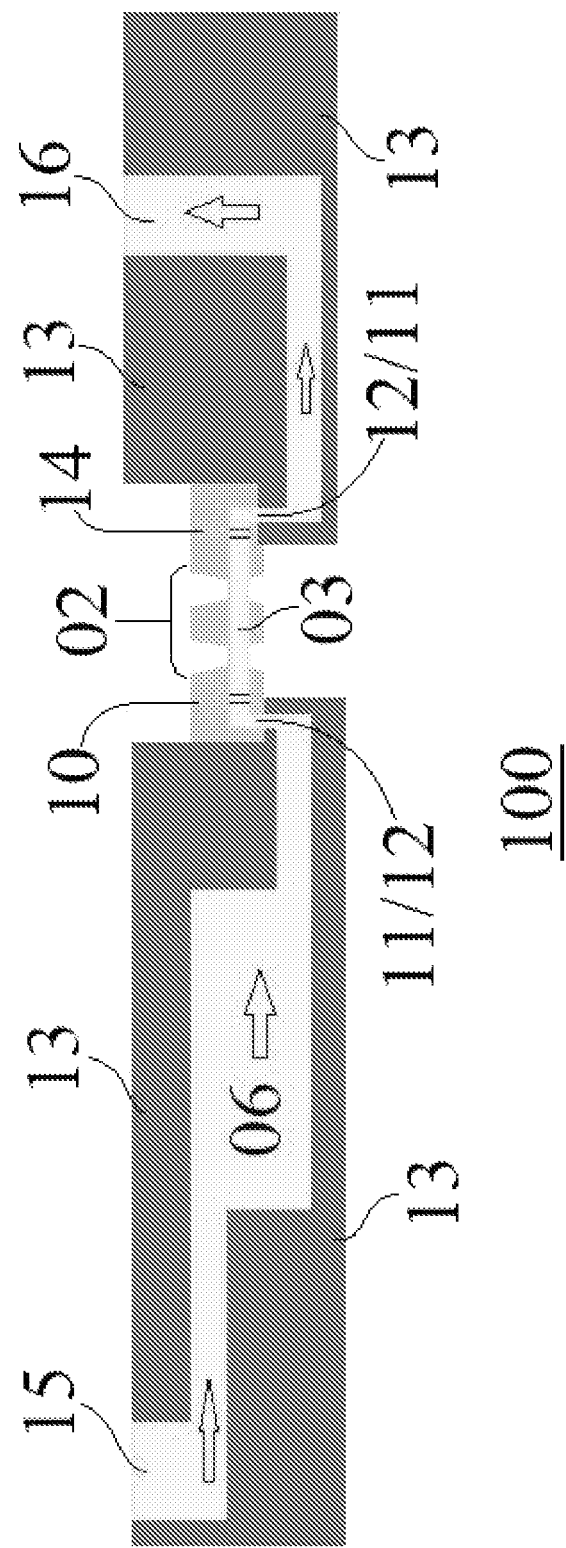
FIG. 4 illustrates the design of another packaged MEMS sample device in accordance with an exemplary embodiment of the present invention.

The flow direction of the liquid sample 06 may be unidirectional or one-way as shown in FIG. 3. However, the flow direction of the liquid sample 06 may be directionless, bidirectional, or two-way, as shown in FIG. 4. The MEMS sample holder in FIG. 4 includes a first filter section 10 between the sample inlet 11 and the observation section 02; and a second filter section 14 between the sample outlet 12 and the observation section 02. Both filter sections (10, 14) are defined between extensions of the first layer 04 and extensions of the second layer 05; and they are configured for filtering the liquid sample 06 before the sample 06 flows into the sample compartment 03, so that the sample inlet 11 can alternatively be used as a sample outlet 12 while the sample outlet 12 can alternatively be used as a sample inlet 11.

Figure 5:
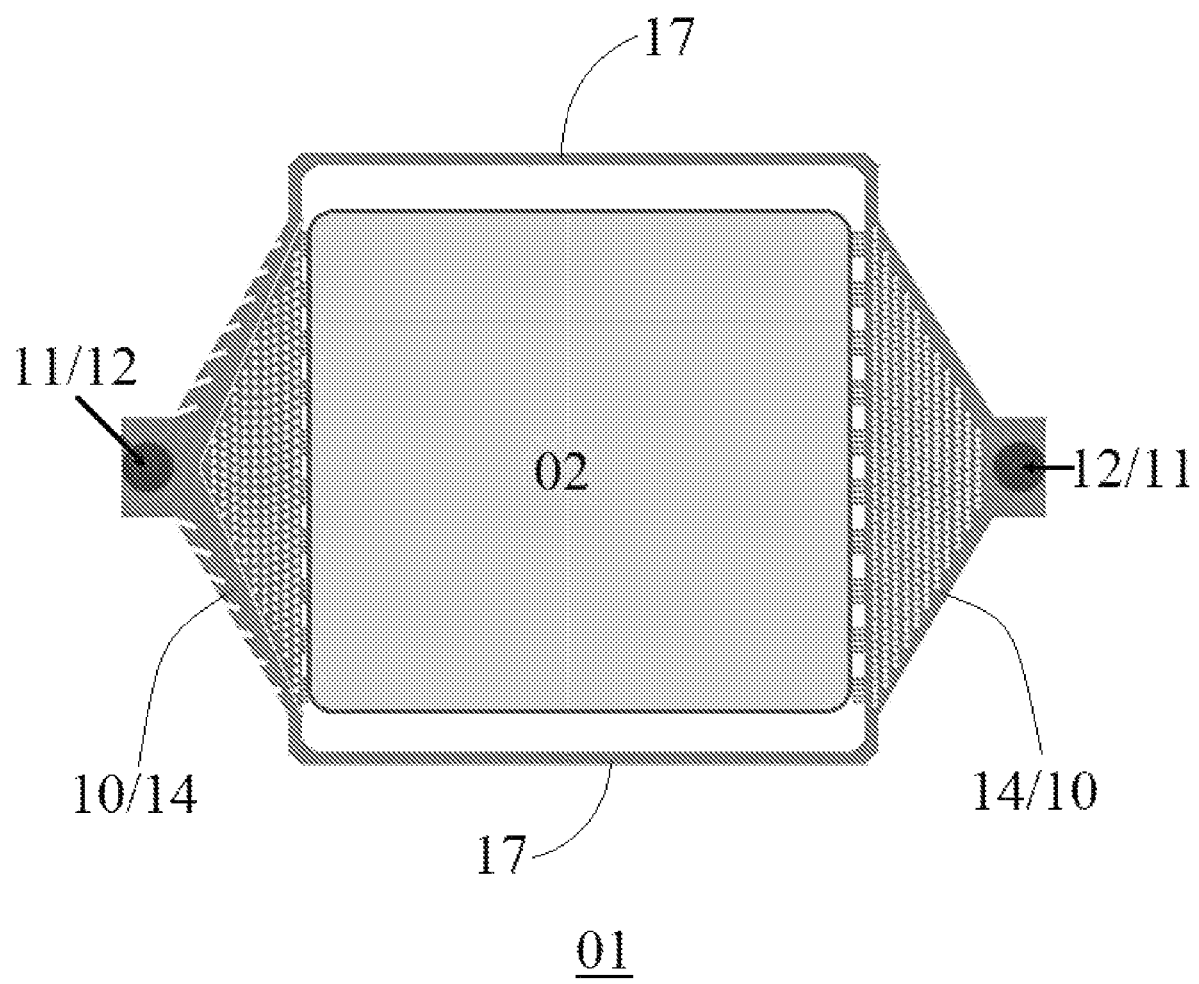
FIG. 5 depicts circumventing tunnels of a MEMS sample holder in accordance with an exemplary embodiment of the present invention.

As shown in FIG. 5, the MEMS sample holder 01 may further include one, two or more circumventing tunnels 17 that bypass the observation section 02 and the filter sections (10, 14). The circumventing tunnel(s) 17 is/are configured for particles in the sample 06 that are too large to pass through the filter section (10, 14), to travel directly from the holder inlet 11 to the holder outlet 12.

Figure 6:
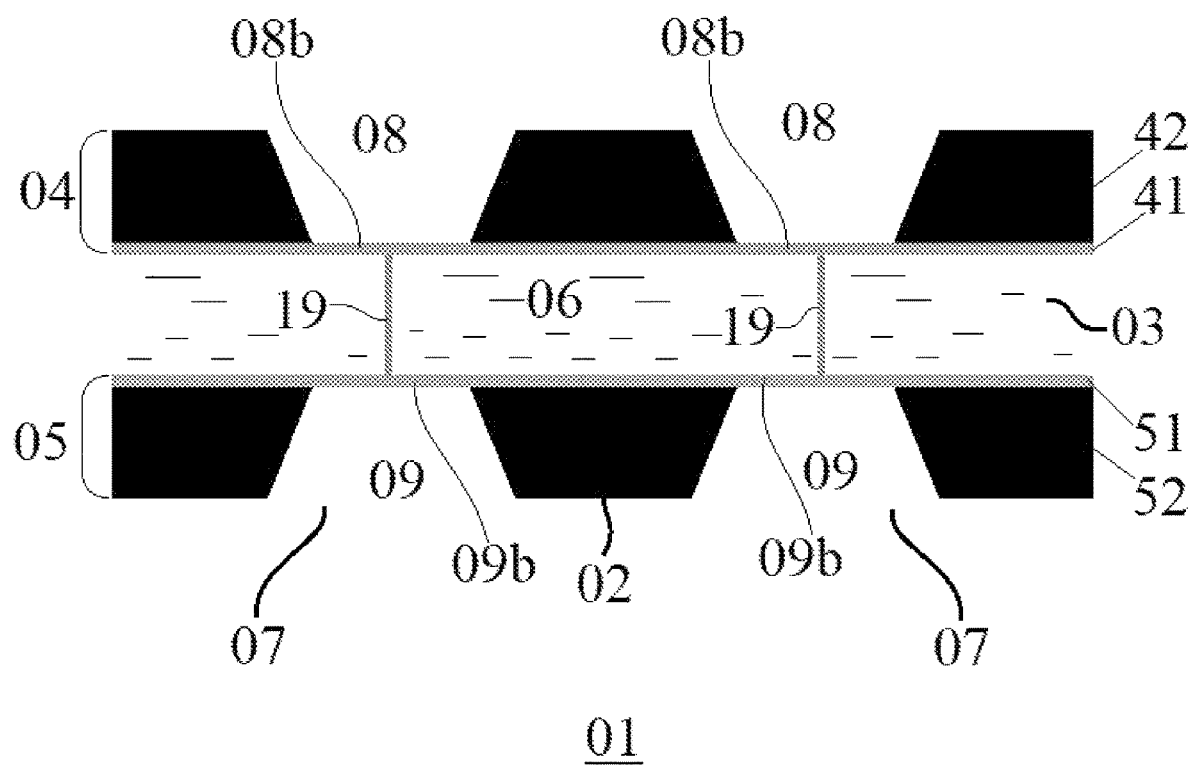
FIG. 6 schematically shows support columns within a sample compartment in accordance with an exemplary embodiment of the present invention.

Referring to FIG. 6, the MEMS sample holder 01 may further include one or more support columns 19 within the sample compartment 03. These support columns 19 connect a thin bottom layer 08b of the first cavity 08 of the window 07 and a thin bottom layer 09b of the second cavity 09b of the window 07. The one or more support columns 19 protect the two thin bottom layers (08b, 09b) from breaking or collapsing, for example, when there is a pressure difference between the inside and the outside of the sample compartment 03. Bottom layers (08b, 09b) of the first cavity 08 and the second cavity 09 may be made of SiN with a thickness of 5 nm-10 nm. In preferred embodiments of the invention, one of the first & second layers (e.g. 05) may comprise or consist of a SiN sub-layer 51 and a substrate sub-layer 52, and another one (e.g. 04) may comprise or consist of a SiN sub-layer 41 and a polysilicone sub-layer 42. Bottom layers (08b, 09b) of the first cavity 08 and the second cavity 09 may be made of only the SiN sub-layers (41, 51) with a thickness of 5 nm-10 nm. The substrate sub-layer 52 and the polysilicone sub-layer 42 may be etched away from first & second layers (04, 05) forming all the cavities (08, 09).

Figure 7:
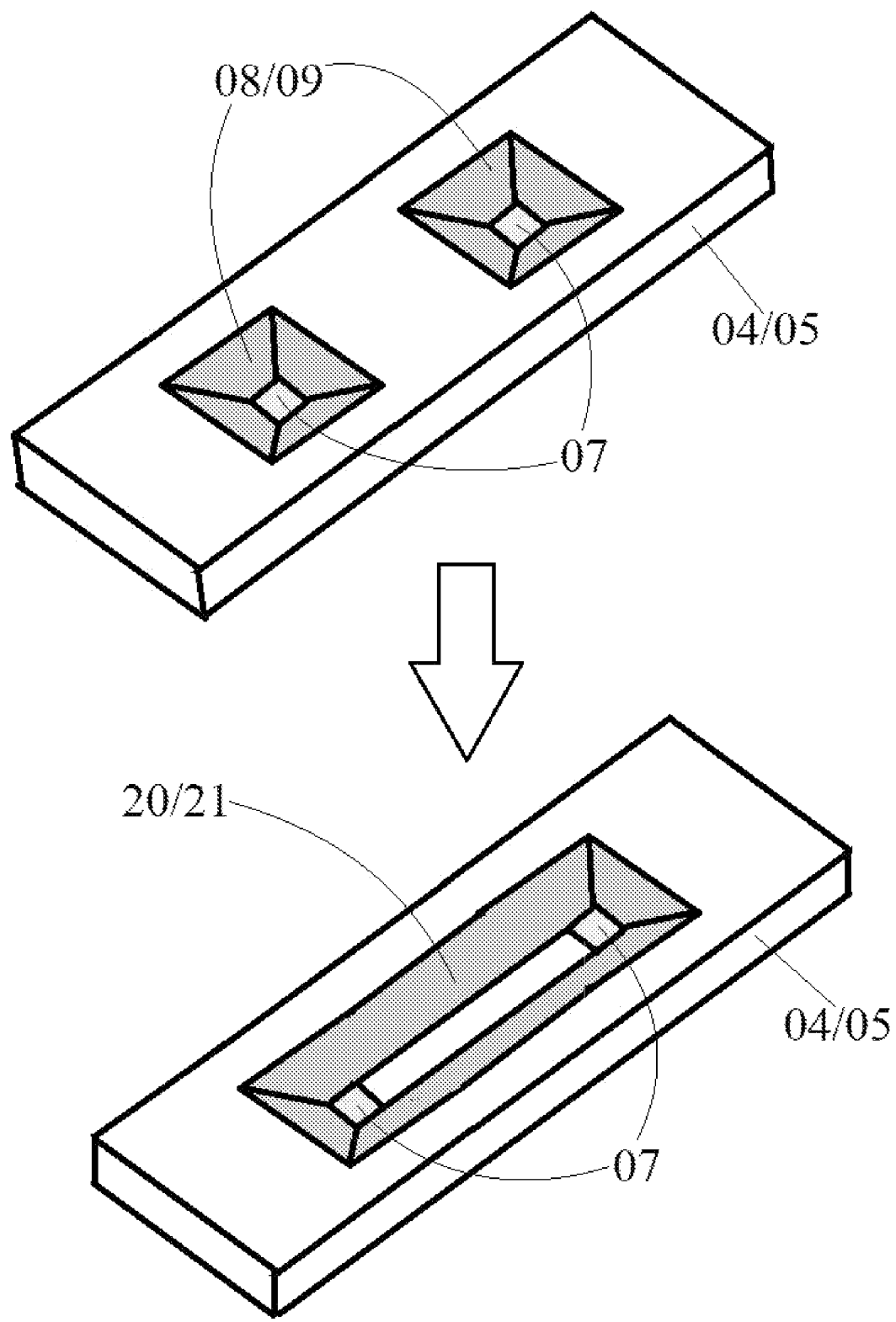
FIG. 7 schematically illustrates the formation of a trench-shaped common cavity in a MEMS sample holder in accordance with an exemplary embodiment of the present invention.

As shown in FIG. 7, two or more of the cavities 08/09 on the first/second layer 04/05 may be merged into a trench-shaped common cavity 20/21.

Figure 8:
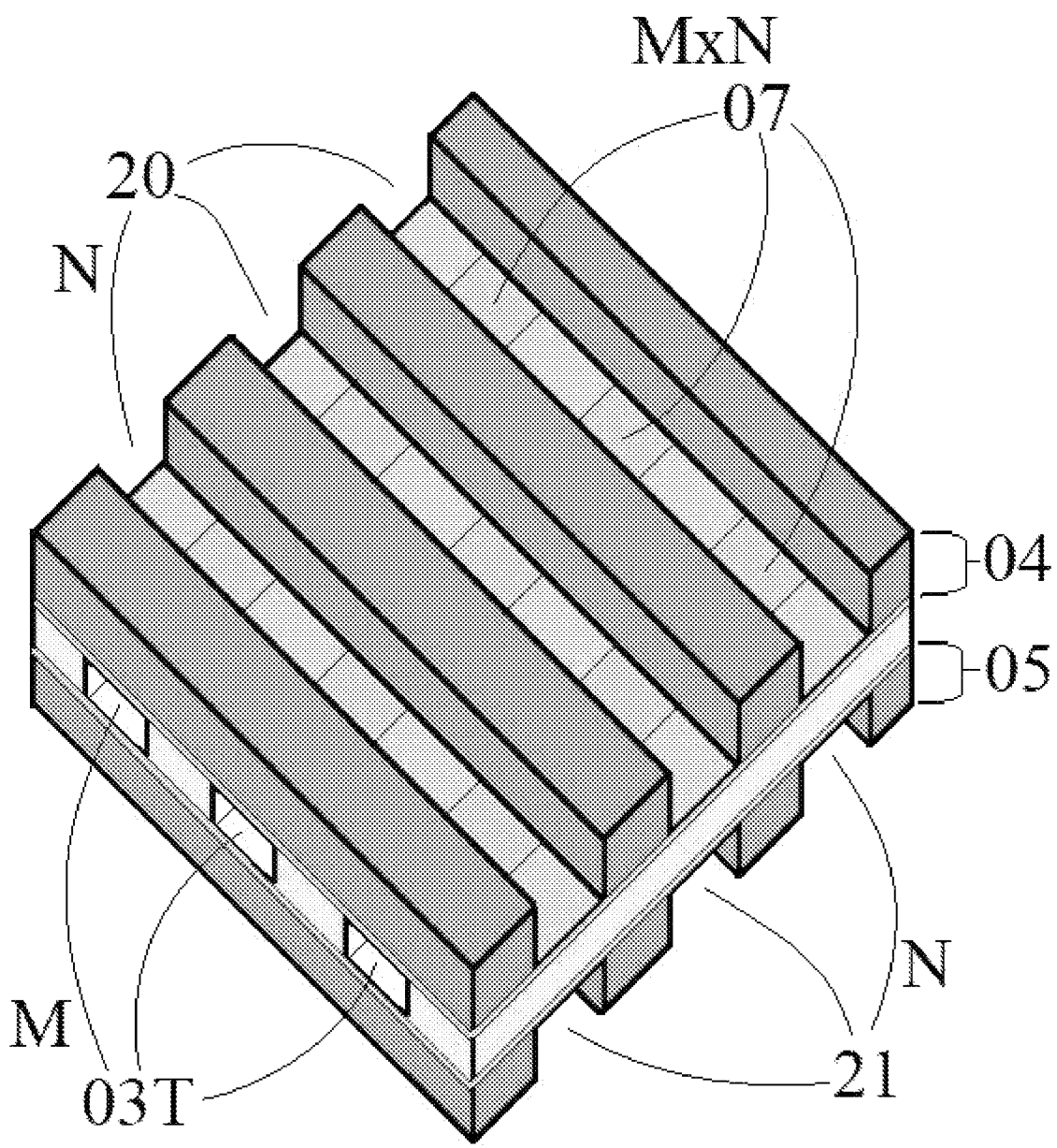
FIG. 8 schematically illustrates windows arranged in a M×N matrix or array in a MEMS sample holder in accordance with an exemplary embodiment of the present invention.

As shown in FIG. 8, the windows 07 may be arranged in a M×N matrix or array, M≥2, and N≥2 (for example M=N=10). The sample compartment 03 may be divided into M≥2 (for example M=10) separate sample tunnels 03T. Each sample tunnel 03T is configured for a liquid sample 06 to flow from one end of the sample tunnel 03T to another end. N≥2 separate windows 07 (for example N=10) may formed on each of the M≥2 separate sample tunnels 03T along the longitudinal direction of each sample tunnel 03T. Two or more cavities 08/09 (preferably all the M cavities) in a row that are outside (or run across) different sample channels 03T may be merged into one trench-shaped common cavity 20/21 on the first/second layer 04/05. All M≥2 cavities 08/09 in each of N≥2 rows and outside (or run across) all M≥2 different sample channels 03T may be merged into one trench-shaped common cavity 20/21 on the first/second layer 04/05, forming windows 07 in a M×N matrix or array as shown in FIG. 8. In preferred embodiments, all the M≥2 sample tunnels 03T are in parallel with each other; all the N≥2 trenches 20/21 are in parallel with each other; and all the M≥2 sample tunnels 03T are perpendicular to all the N≥2 trenches In some specific embodiments, the MEMS sample holder 01 may have a size of 3×3 mm, and it may be used in a TEM/STEM. The observation section 02 may have a size of 2 mm×2 mm with windows 07 each having a size of 100 um×100 um. The thickness/height of the sample compartment 03 at the windows 07 may be from 100 nm to 500 nm.

Referring to FIGS. 3 and 4, the present invention provides a packaged MEMS device 100 comprising the MEMS sample holder 01 as described above, and glass members 13 coated with a metal layer (not shown). The packaged MEMS device 100 may have a size of 10×20 mm, and it may be used as the specimen holder 246 in U.S. Pat. No. 11,094,499 granted to the Applicant on Aug. 17, 2021, which is entirely incorporated herein by reference.

Figure 9:
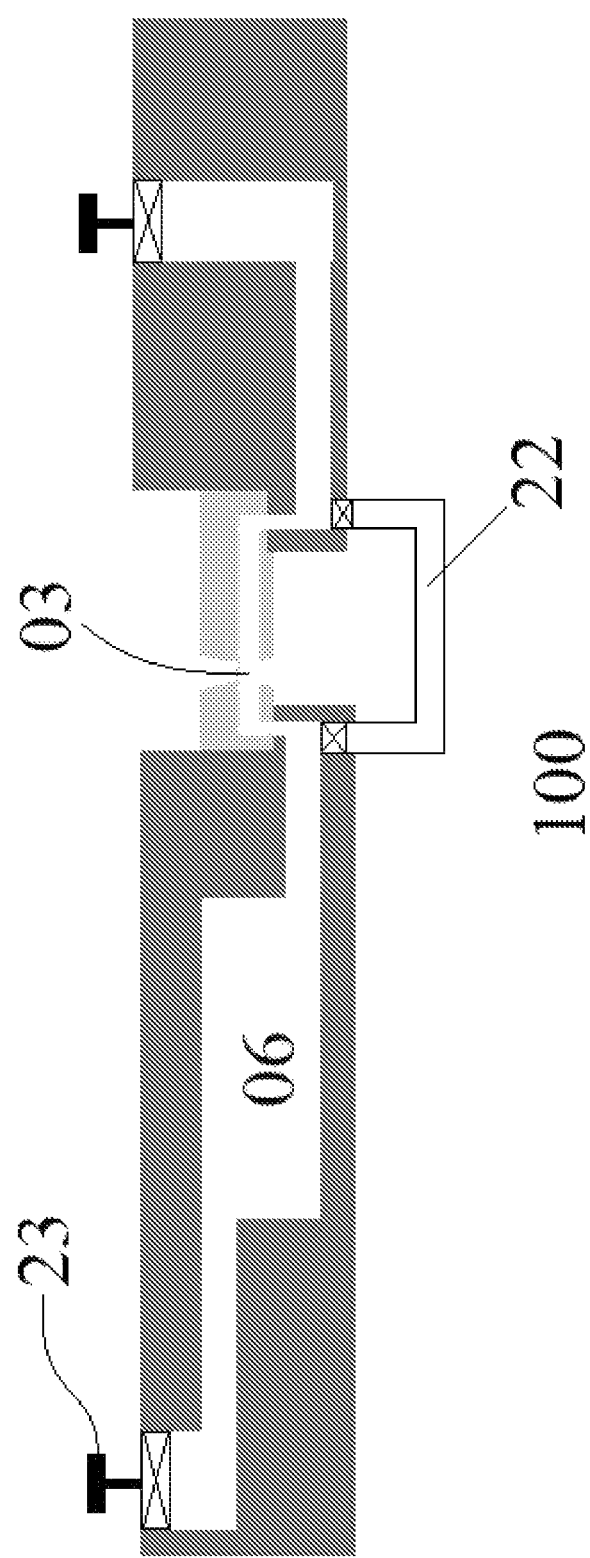
FIG. 9 schematically illustrates a large by-pass channel used to quickly drain dead spaces filled with old liquid sample in a MEMS sample holder in accordance with an exemplary embodiment of the present invention.

As shown in FIG. 9, when the old liquid sample 06 needs to be replaced with new liquid sample 06, a large by-pass channel 22 may be used to quickly drain dead spaces filled with old liquid sample. When the pressure difference between the inside and outside of the window 07 is too big, the 4-nm "naked" SiN window layer may be ruptured or broken. A pressure controller 23 may be used to adjust the internal pressure within the sample compartment 03, so that the pressure difference does not become dangerously big. For example, when the packaged MEMS sample holder 100 is used in the vacuum environment of the sample chamber of an electron microscope, the pressure controller 23 may reduce the internal pressure within the sample compartment 03 to a safe range.

Fabrication of the MEMS sample holder 01 as described above may be carried out using any methods known in the technical field of micro-electromechanical system (MEMS). The process can be accomplished using surface micromachining techniques, bulk micromachining techniques, high aspect ratio (HAR) silicon micromachining, and semiconductor processing techniques etc.

Surface micromachining creates structures on top of a substrate using a succession of thin film deposition and selective etching. Generally, polysilicon is used as one of the layers and silicon dioxide is used as a sacrificial layer which is removed or etched out to create the necessary void in the thickness direction. Added layers are generally very thin with their size varying from 2-5 micrometers. A main advantage is realizing monolithic microsystems in which the electronic and the mechanical components (functions) are built in on the same substrate. As the structures are built on top of the substrate and not inside it, the substrate's properties are not as important as in bulk micromachining, and the expensive silicon wafers can be replaced by cheaper substrates, such as glass, plastic, PET substrate, or other non-rigid materials. The size of the substrates can also be much larger than a silicon wafer.

Complicated components may be built using a sacrificial layer. There are many possible combinations of structural/sacrificial layer. The combination chosen depends on the process. For example, it is important for the structural layer not to be damaged by the process used to remove the sacrificial layer.

Bulk micromachining produces structures inside a substrate by selectively etching inside the substrate. Bulk micromachining starts with a silicon wafer or other substrates which is selectively etched, using photolithography to transfer a pattern from a mask to the surface. Bulk micromachining can be performed with wet or dry etches, although the most common etch in silicon is the anisotropic wet etch. This etch takes advantage of the fact that silicon has a crystal structure, which means its atoms are all arranged periodically in lines and planes. Certain planes have weaker bonds and are more susceptible to etching. The etch results in pits that have angled walls, with the angle being a function of the crystal orientation of the substrate.

Silicon wafer can be anisotropically wet etched, forming highly regular structures. Wet etching typically uses alkaline liquid solvents, such as potassium hydroxide (KOH) or tetramethylammonium hydroxide (TMAH) to dissolve silicon which has been left exposed by the photolithography masking step. These alkali solvents dissolve the silicon in a highly anisotropic way, with some crystallographic orientations dissolving up to 1000 times faster than others. Such an approach is often used with very specific crystallographic orientations in the raw silicon to produce V-shaped grooves. The surface of these grooves can be atomically smooth if the etch is carried out correctly, and the dimensions and angles can be precisely defined.

In various embodiments of the invention, the MEMS sample holder 01 may be made using a MEMS manufacturing process. Materials for the process may include silicon, polymers, metals, and ceramics etc. Deposition processes can be carried out using physical deposition and chemical deposition. Patterning can be carried out using lithography, electron beam lithography, ion beam lithography, ion track technology, X-ray lithography, and diamond patterning. Wet etching can be carried out using isotropic etching, anisotropic etching, HF etching, and electrochemical etching. Dry etching can be carried out using vapor etching (e.g. xenon difluoride) and plasma etching (e.g. sputtering and reactive ion etching (RIE)).

Figure 10:
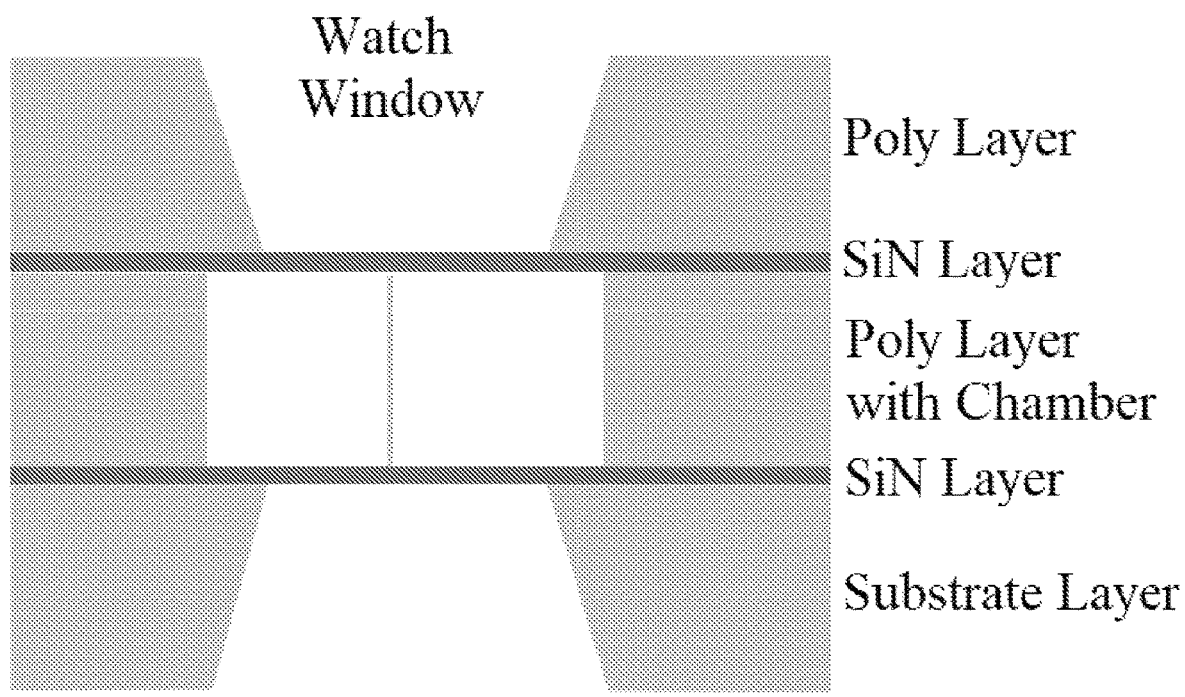
FIG. 10 schematically illustrates a MEMS-based sample window with nano-filter structure and a support's adapter with microfluid structure used in a MEMS sample holder in accordance with an exemplary embodiment of the present invention.

FIG. 10 shows a specific embodiment having some components same or similar to those illustrated in FIGS. 1-9 (by reference numbers), a new MEMS-based sample window 07 with nano-filter structure (10, 14) and a support's adapter 19 with microfluid structure are used in the MEMS sample holder 01. Any known semiconductor processing flow can be applied in the MEMS structure. A chamber structure 03 with two sides of SiN layer (04, 05) can be manufactured by current semiconductor flow with SiO2 sacrifice layer. This watch chamber 03 will have a big size such as 100 um×100 um with internal support structure 19 to support the SiN layers (08b, 09b).

Figure 11:
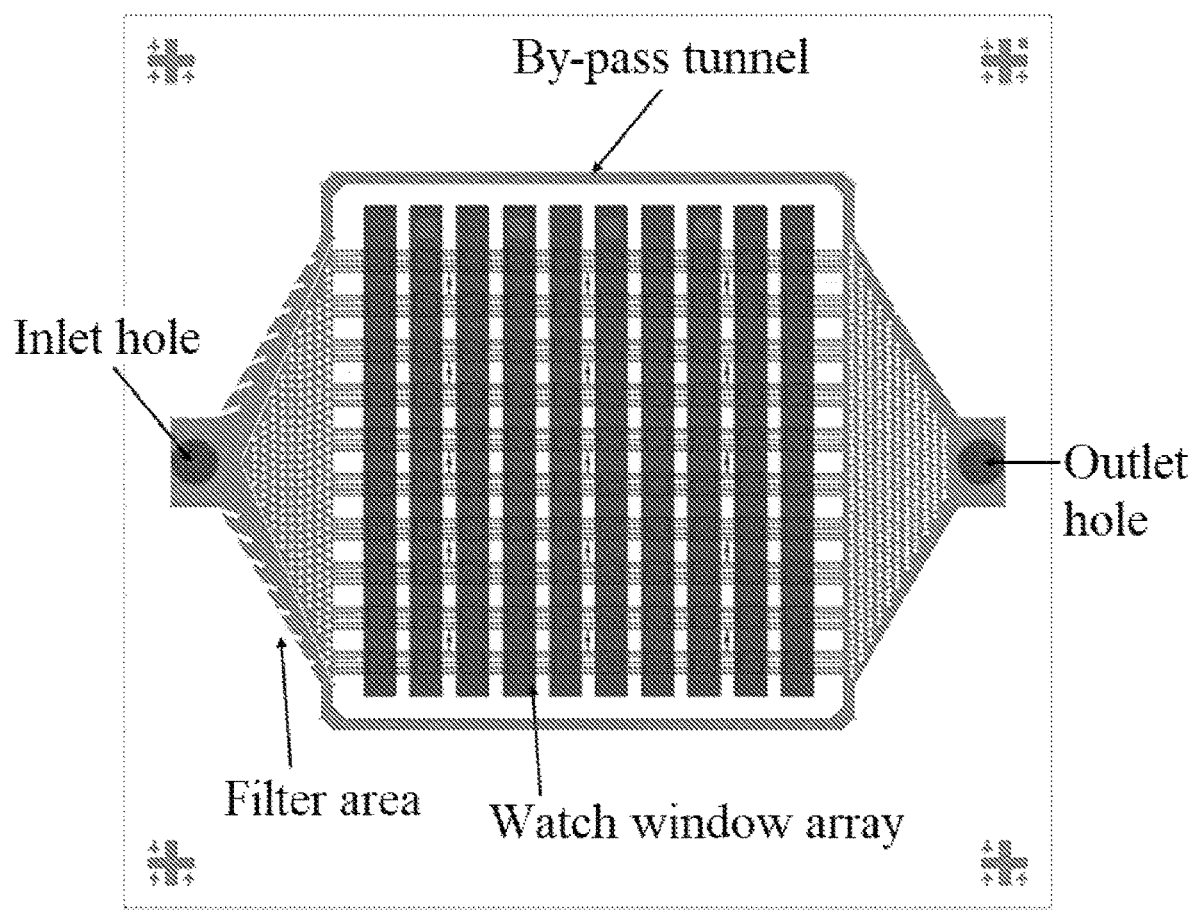
FIG. 11 schematically shows watch windows arranged as 2D array structure in a MEMS sample holder in accordance with an exemplary embodiment of the present invention.

FIG. 11 shows a specific embodiment having some components same or similar to those illustrated in FIGS. 1-9 (by reference numbers), the watch windows 07 may be arranged as 2D array (for example, M×N=10×10) structure. Each watch window 07 may be linked to a small tunnel 03T. There is also a cylinder 18 array structure with nano gaps which work as nano size particle filter (10, 14). A by-pass tunnel structure 17 is designed to allow big particles to flow through and not to block watch window cells 07.

Figure 12:
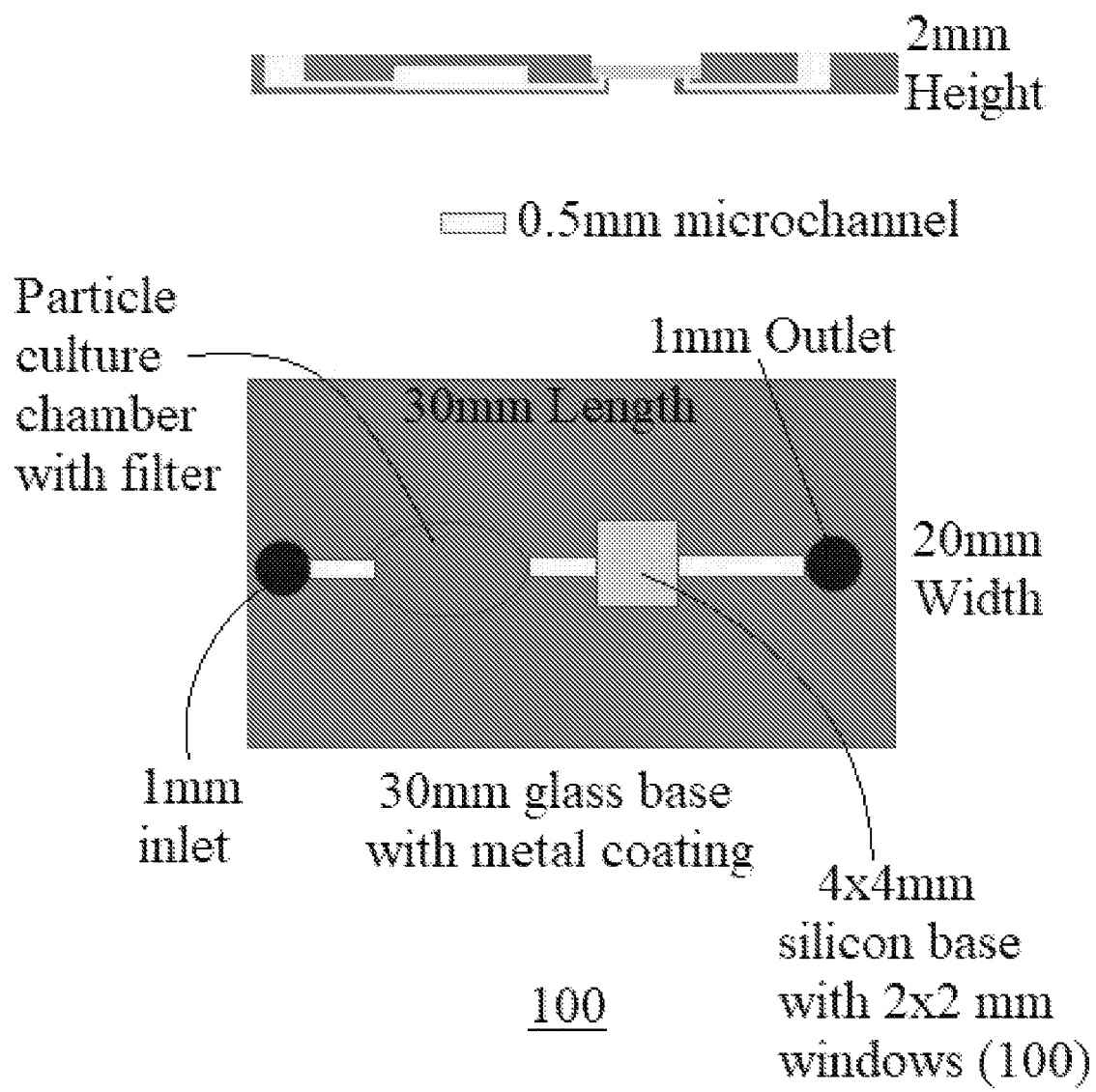
FIG. 12 shows the sizes of a packaged MEMS device in accordance with an exemplary embodiment of the present invention.
Figure 13:
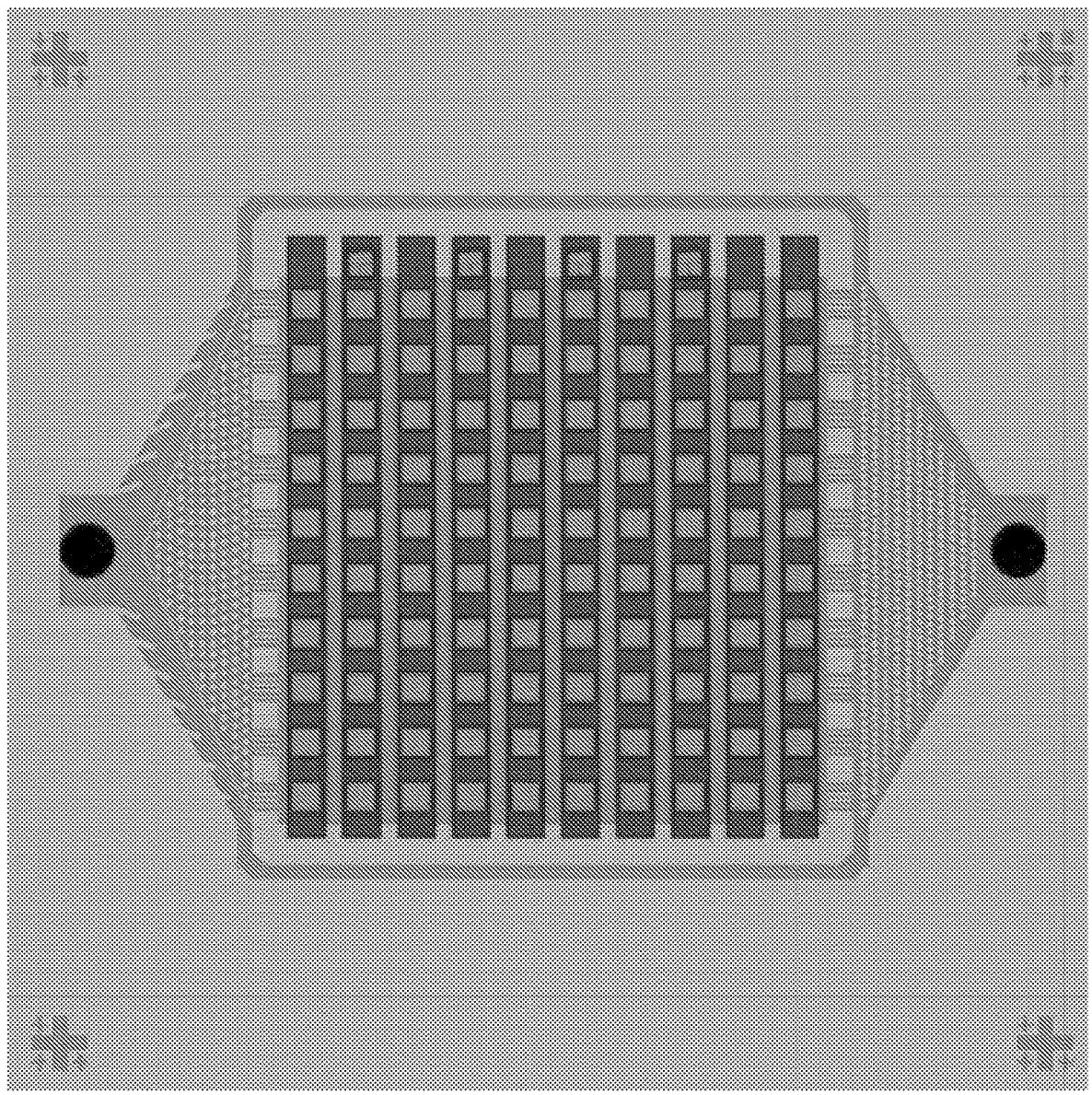
FIG. 13 shows the sizes of an entire MEMS chip in accordance with an exemplary embodiment of the present invention.

FIG. 12 shows a packaged MEMS device 100 with total size of 30 mm (Length)×20 mm (Width)×2 mm (Height). In FIG. 13, the entire MEMS chip has a size of 4 mm×4 mm. The center area has a size of 2 mm×2 mm with 10×10 windows 07. Each chamber window 07 has a size of 100 um×100 um. The chamber 03 may have a height of 500 nm~1000 nm.

Figure 14:
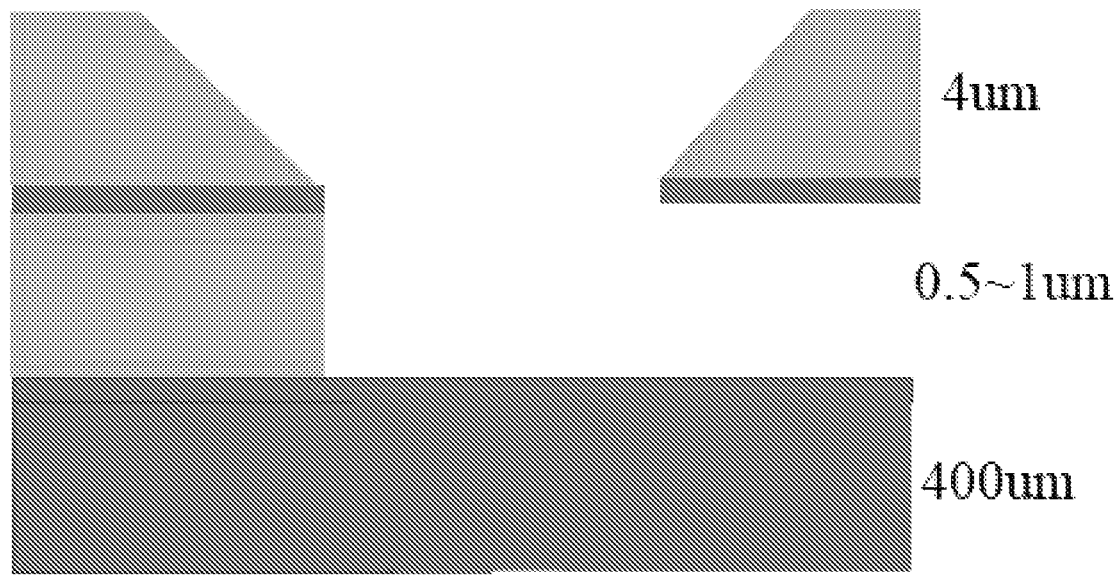
FIG. 14 shows the sizes around an inlet in a MEMS sample holder in accordance with an exemplary embodiment of the present invention.
Figure 15:
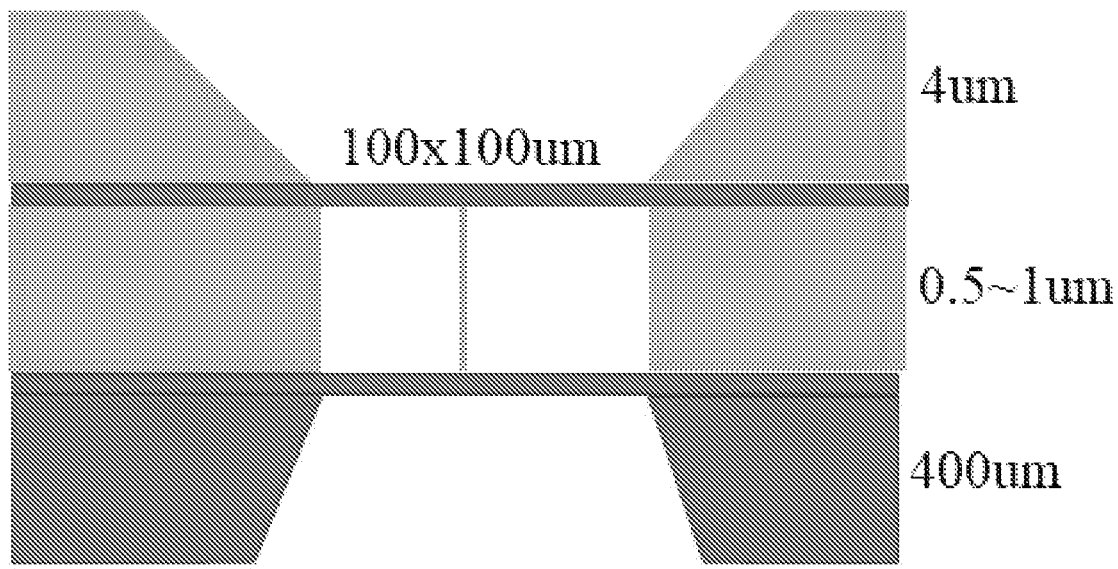
FIG. 15 shows the sizes around a chamber window in a MEMS sample holder in accordance with an exemplary embodiment of the present invention.

FIG. 14 shows the sizes around the inlet. Chamber 03 height is about 500 nm~1000 nm. Chamber 03 top layer 04 has a thickness of ~4 um. The substrate has a thickness of 400-500 um. FIG. 15 shows the sizes around a chamber window 07. Chamber 03 height is about 500 nm~1000 nm. Chamber 03 top layer 04 has a thickness of ~4 um. The substrate has a thickness of 400-500 um. Each chamber window 07 has a size of 100 um×100 um.

Figure 16:
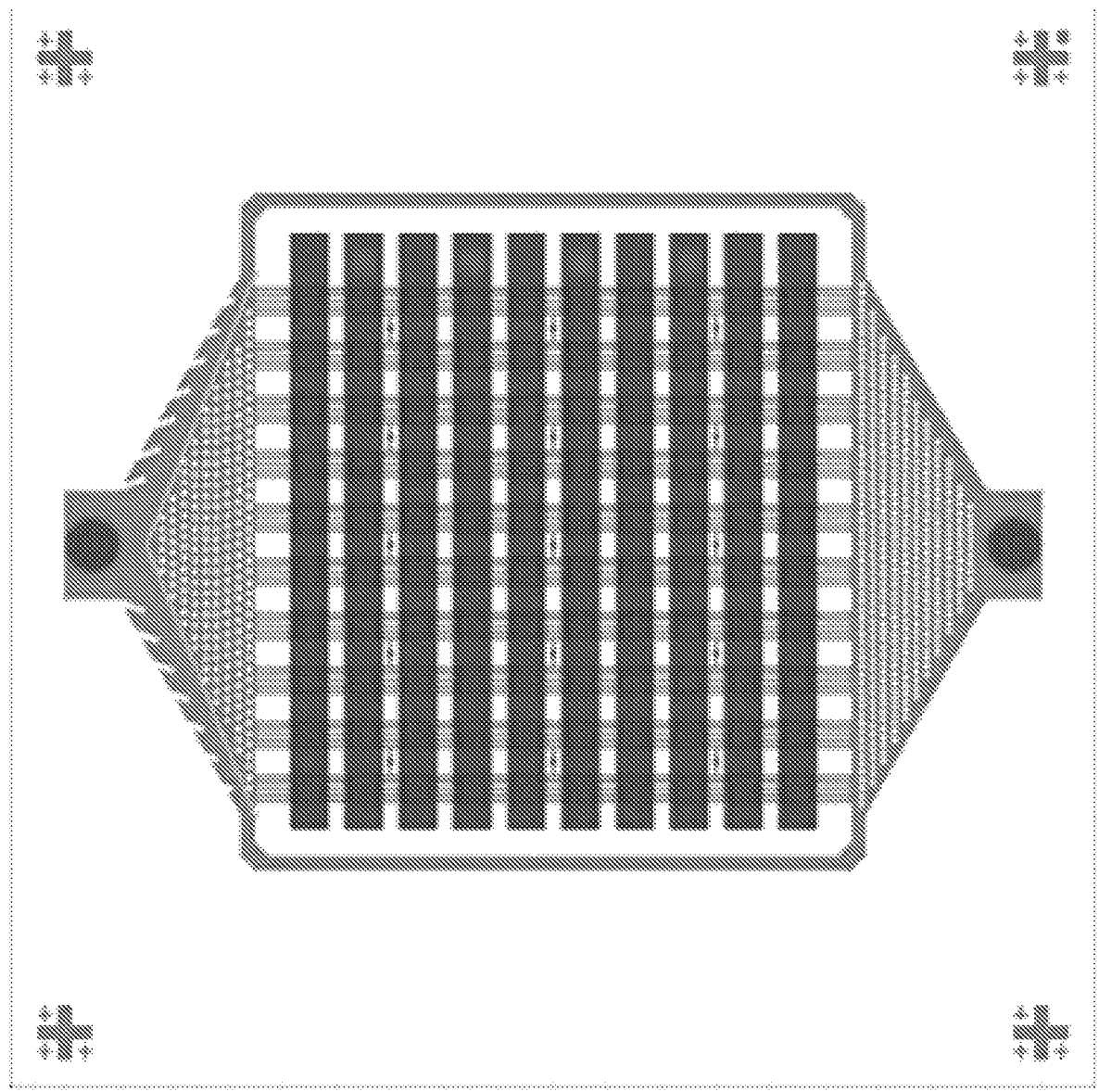
FIG. 16 schematically illustrates the full mask overview with all layers for the fabrication process of a MEMS sample holder in accordance with an exemplary embodiment of the present invention.
Figure 17:
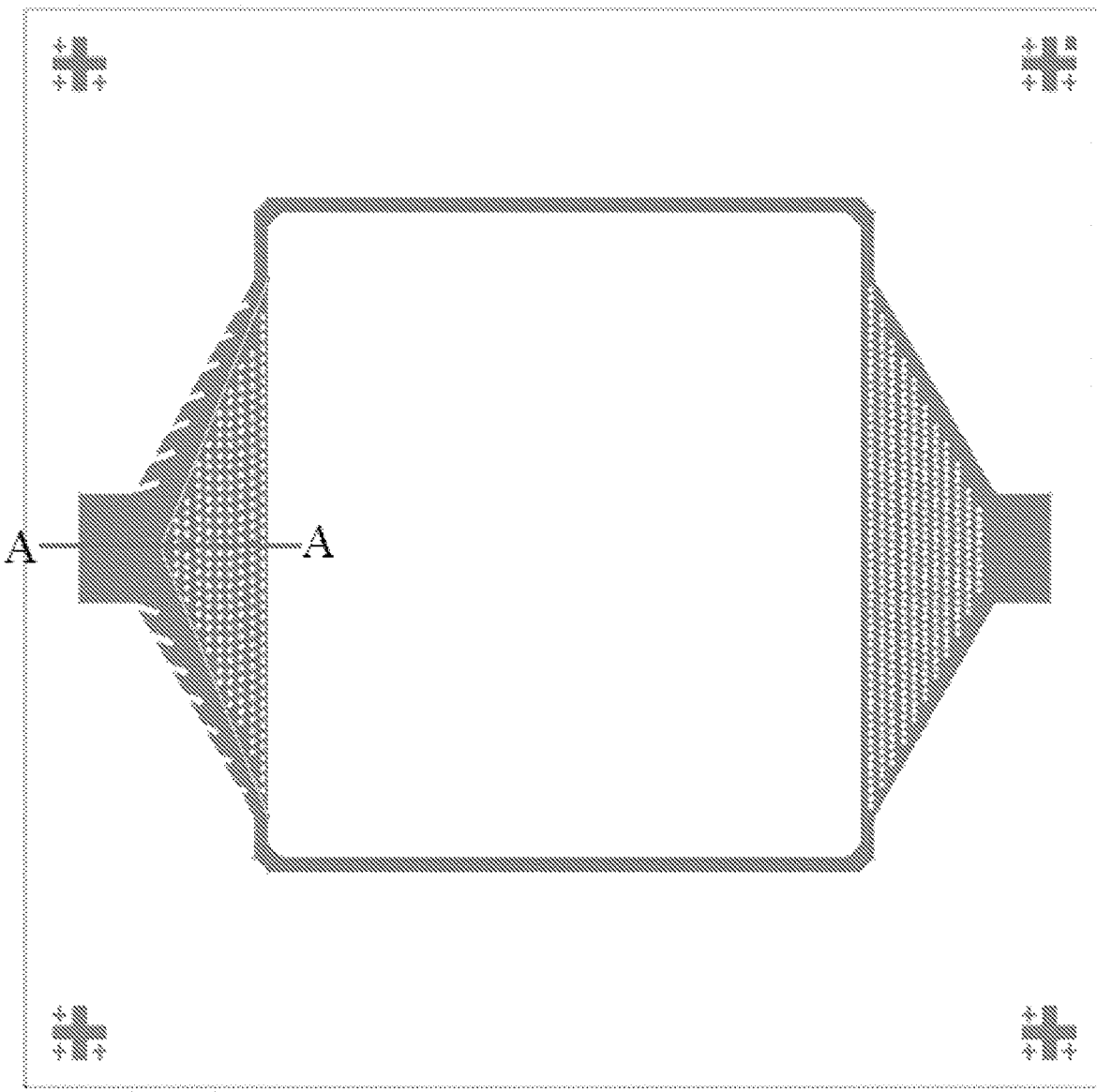
FIG. 17 schematically illustrates a substrate etch mask with an etch depth of 2 um for the fabrication process of a MEMS sample holder in accordance with an exemplary embodiment of the present invention.
Figure 18:
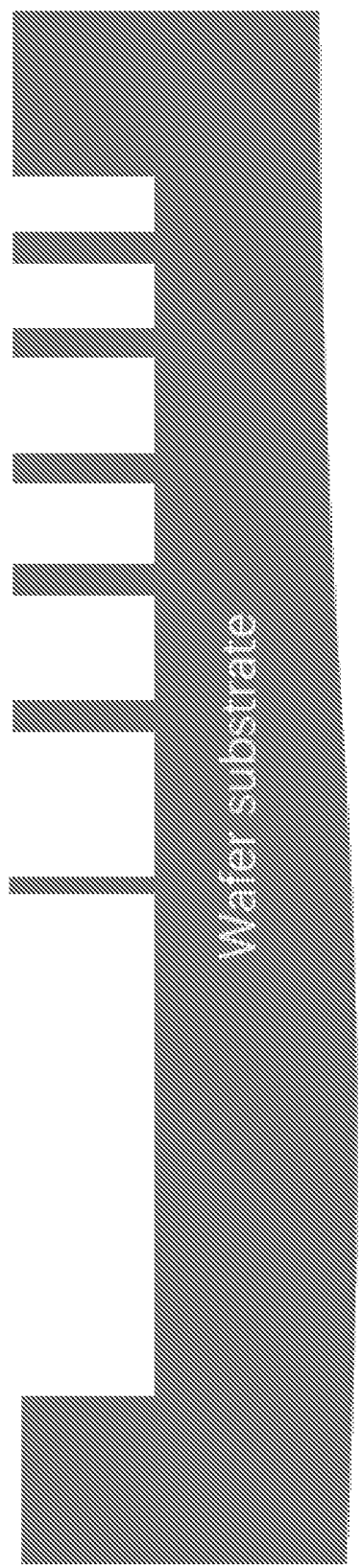
FIG. 18 is a cross-sectional view along line A-A in FIG. 17.
Figure 19:
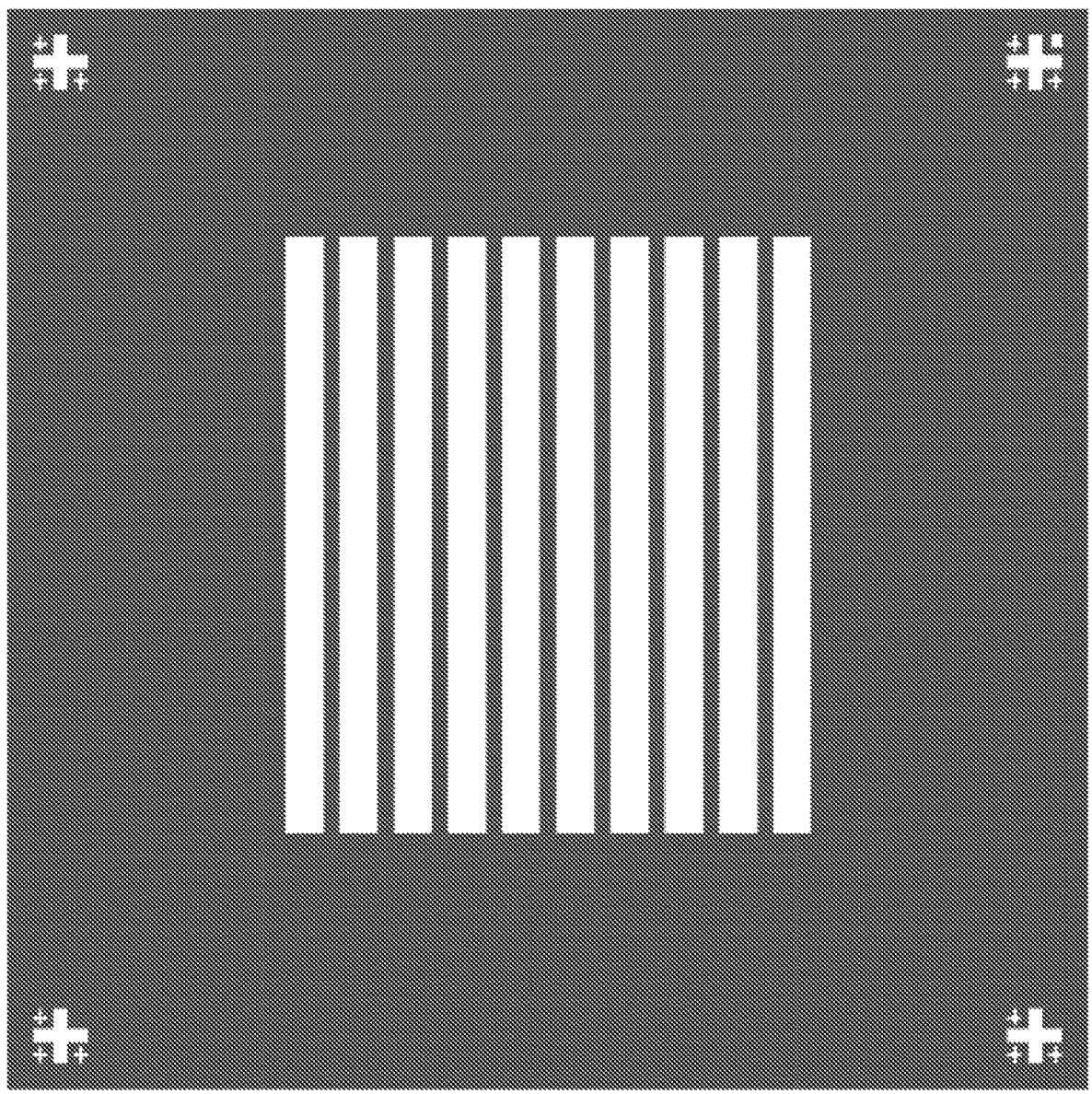
FIG. 19 schematically illustrates a SN etch mask with etch depth of 0.5 um for the fabrication process of a MEMS sample holder in accordance with an exemplary embodiment of the present invention.
Figure 20:
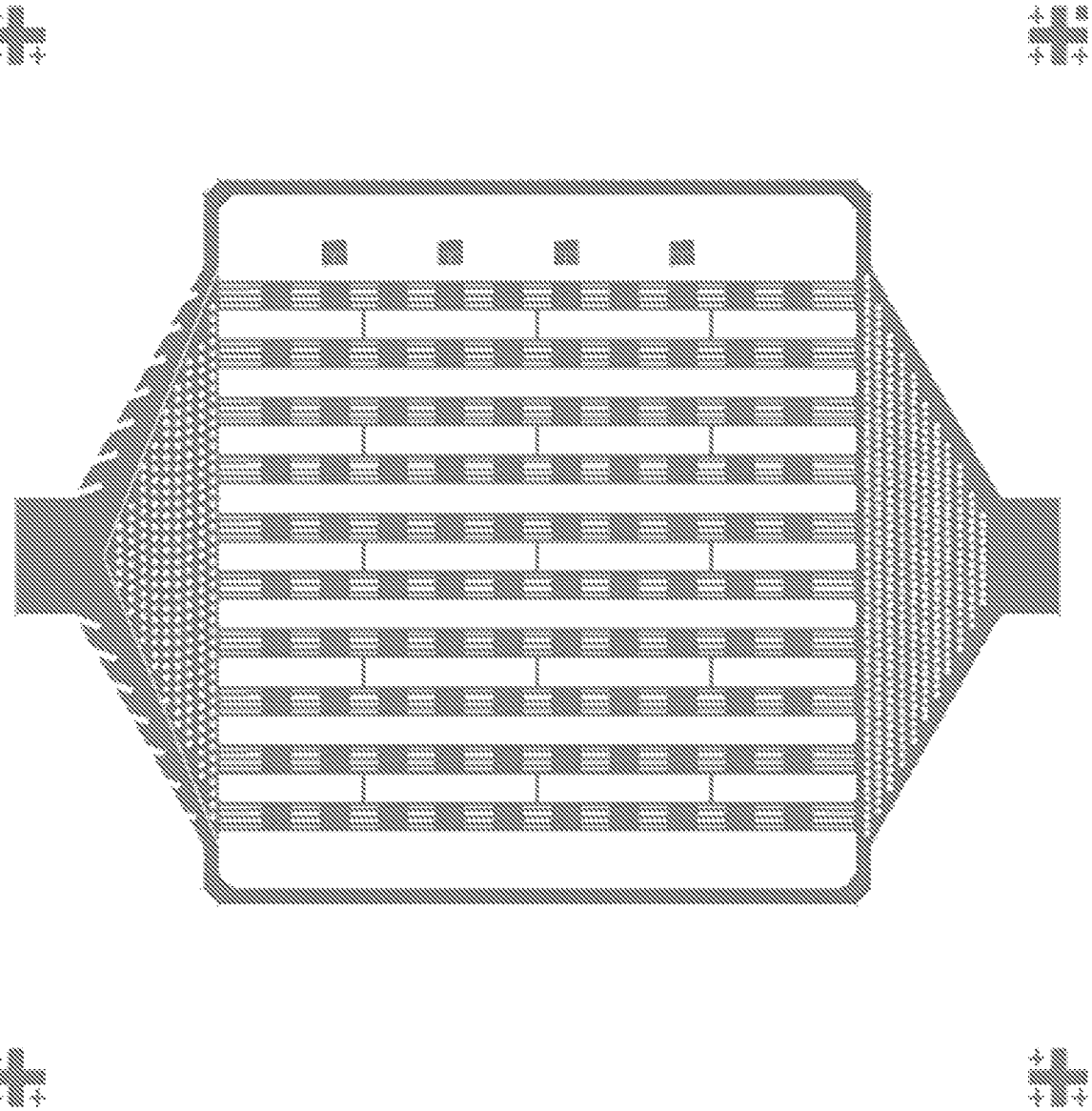
FIG. 20 schematically illustrates a watch window etch mask with etch POLY depth of 0.5 um for the fabrication process of a MEMS sample holder in accordance with an exemplary embodiment of the present invention.
Figure 21:
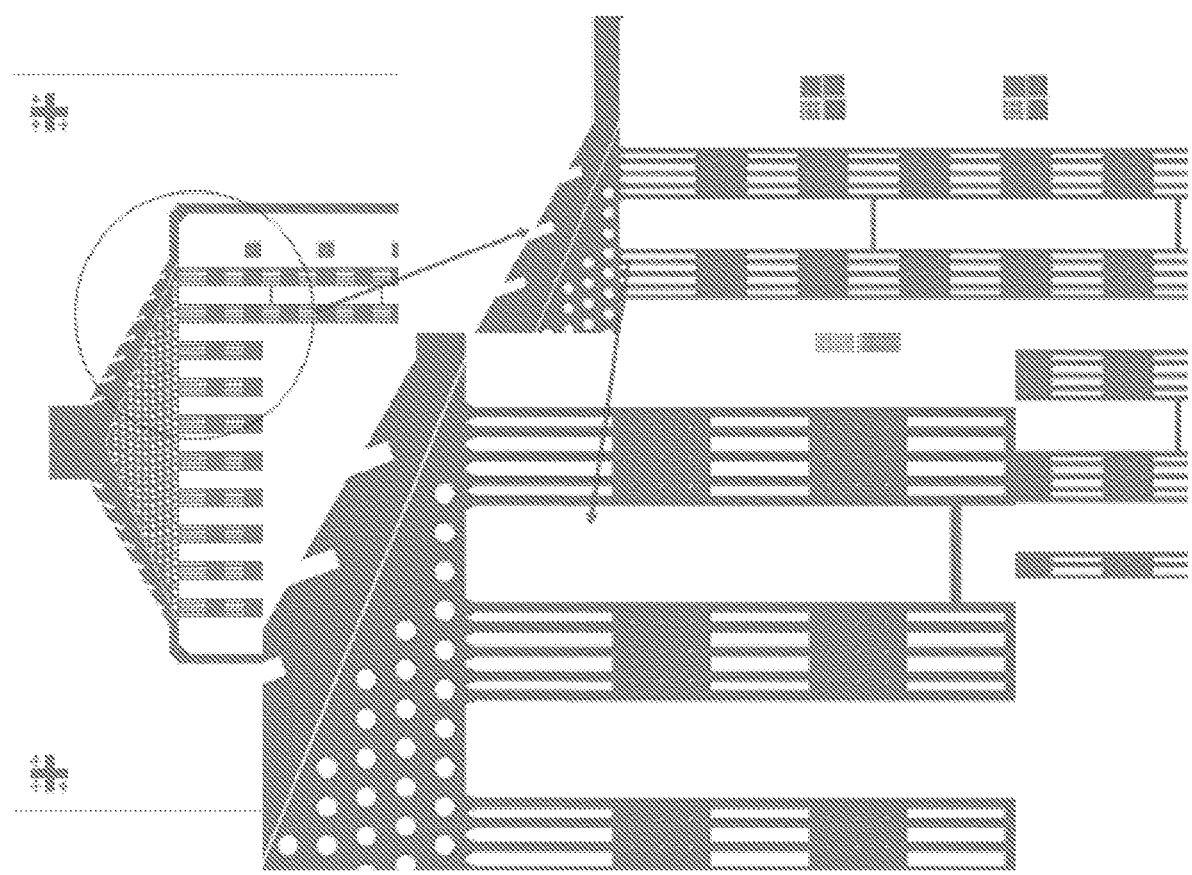
FIG. 21 shows more details of the watch window etch mask in FIG. 20.
Figure 22:
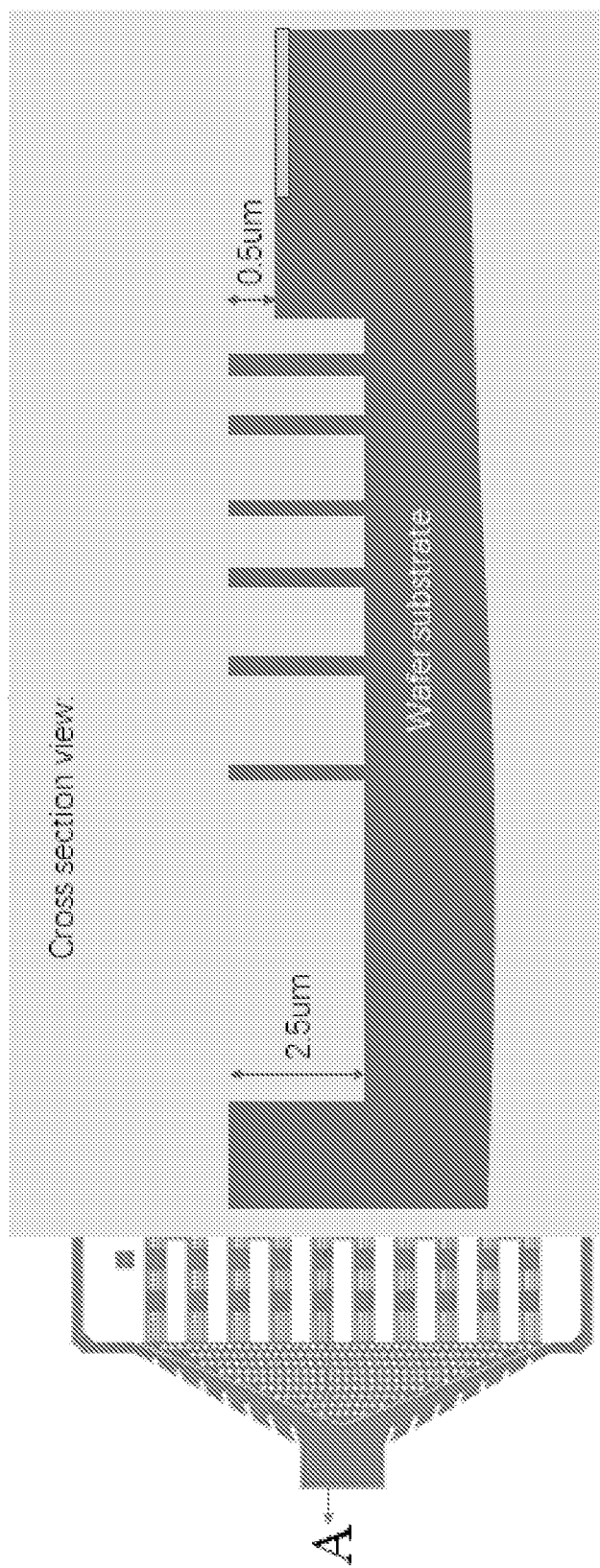
FIG. 22 is the cross-sectional view along line A in FIG. 20 structure.
Figure 23:
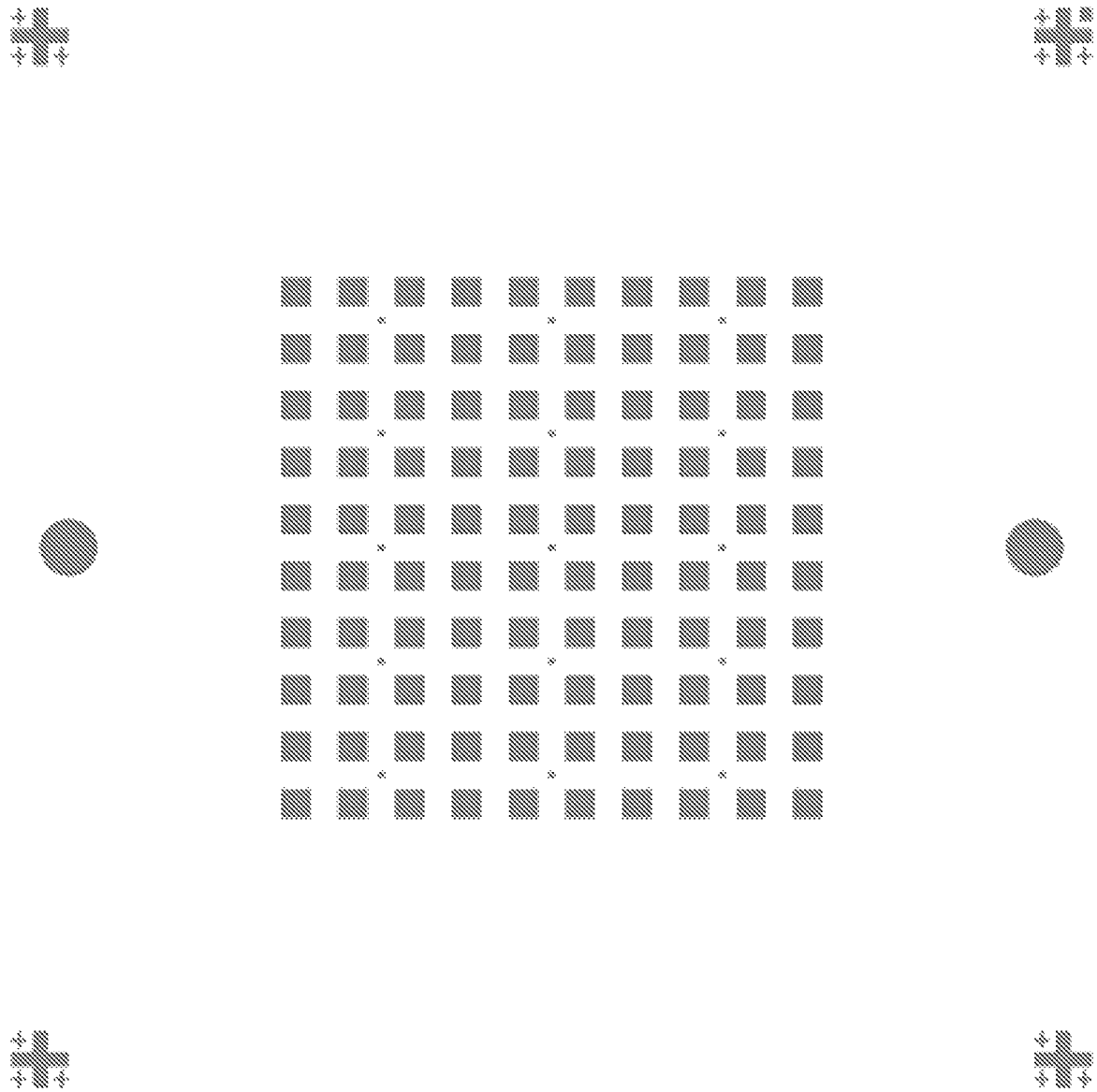
FIG. 23 schematically illustrates an inlet and outlet hole etch for the fabrication process of a MEMS sample holder in accordance with an exemplary embodiment of the present invention.
Figure 26:
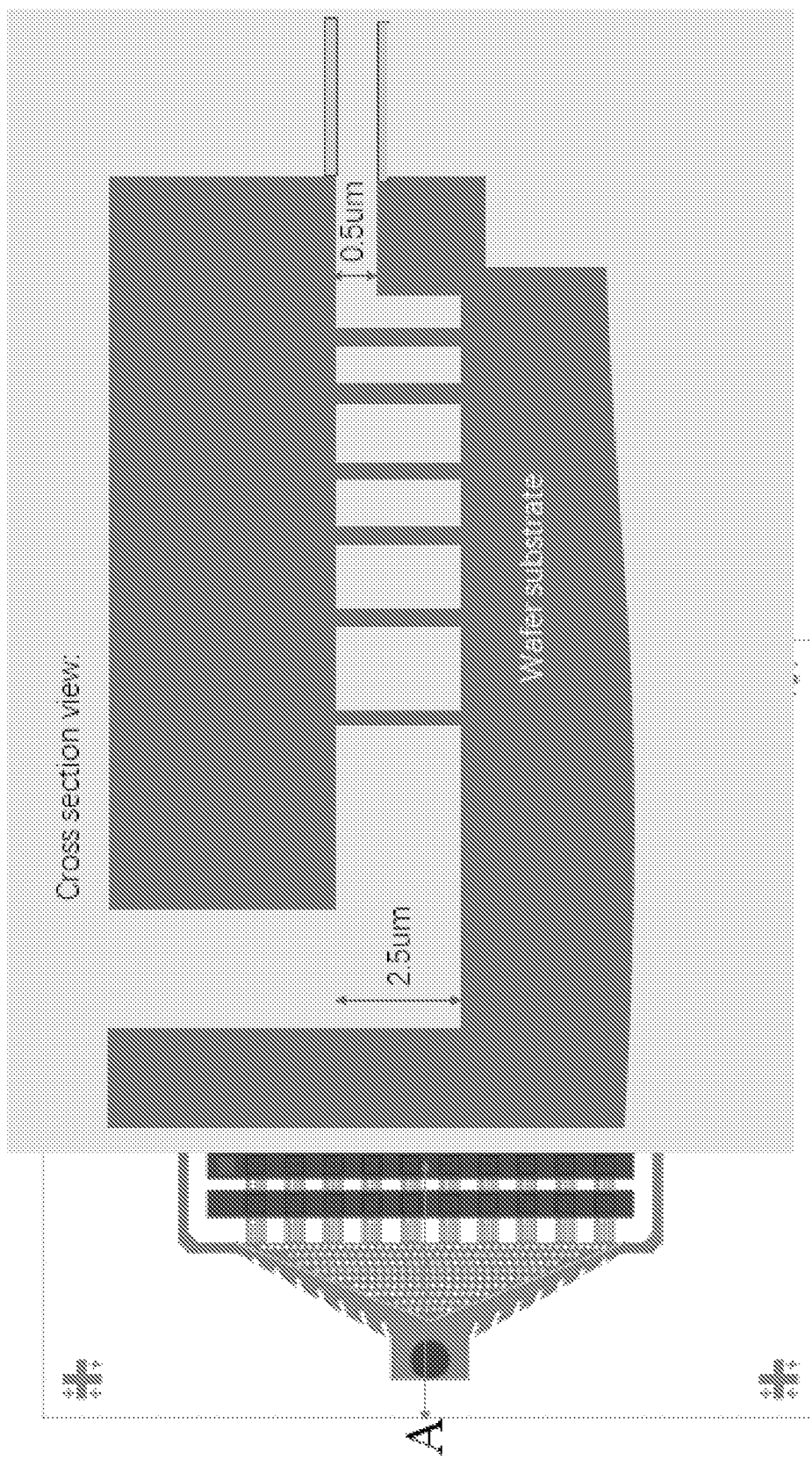
FIG. 26 is the cross-sectional view along line A in FIG. 16 structure.
Figure 27:
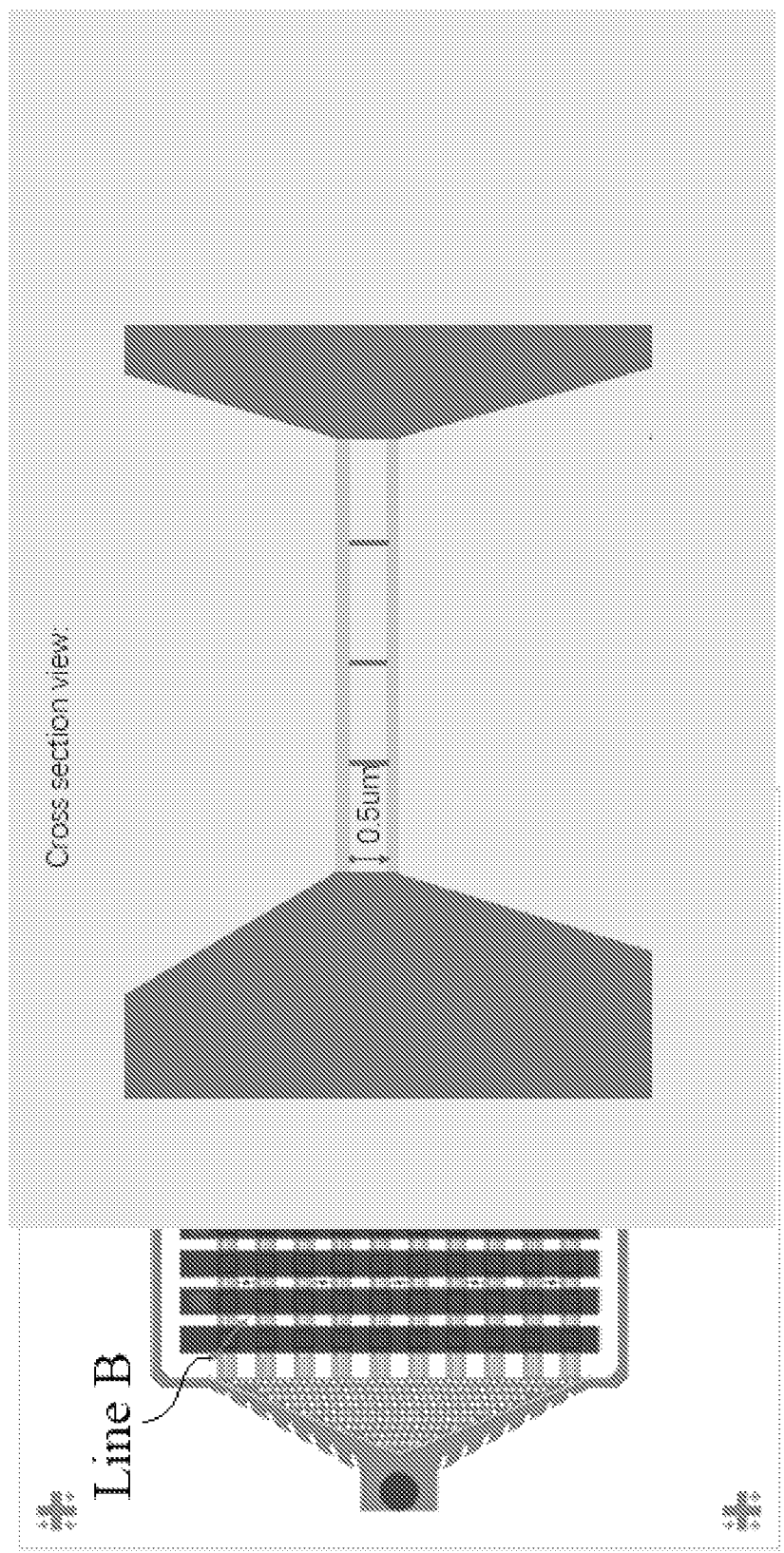
FIG. 27 is the cross-sectional view along line B in FIG. 16 structure.

FIG. 16 shows the full mask overview with all layers for the fabrication process. FIG. 17 is MASK 1 which is a substrate etch mask with an etch depth of 2 um. FIG. 18 is the cross-sectional view along line A-A in FIG. 17. FIG. 19 is MASK 2—SN etch mask with etch depth of 0.5 um, which just keeps watch window area. FIG. 20 is MASK 3—watch window etch mask with etch POLY depth of 0.5 um. FIG. 21 shows more details of MASK 3 in FIG. 20. FIG. 22 is the cross-sectional view along line A in FIG. 20 structure. FIG. 23 is MASK 4—inlet and outlet hole etch with watch window etch with an etch POLY depth of 4 um. FIG. 24 is MASK 5—wafer substrate back side etch window, etching and keeping substrate around 200 or 100 um. FIG. 25 is MASK 6—wafer substrate back side etch watch window to SN layer. FIG. 26 is the cross-sectional view along line A in FIG. 16 structure. FIG. 27 is the cross-sectional view along line B in FIG. 16 structure.

Figure 28:
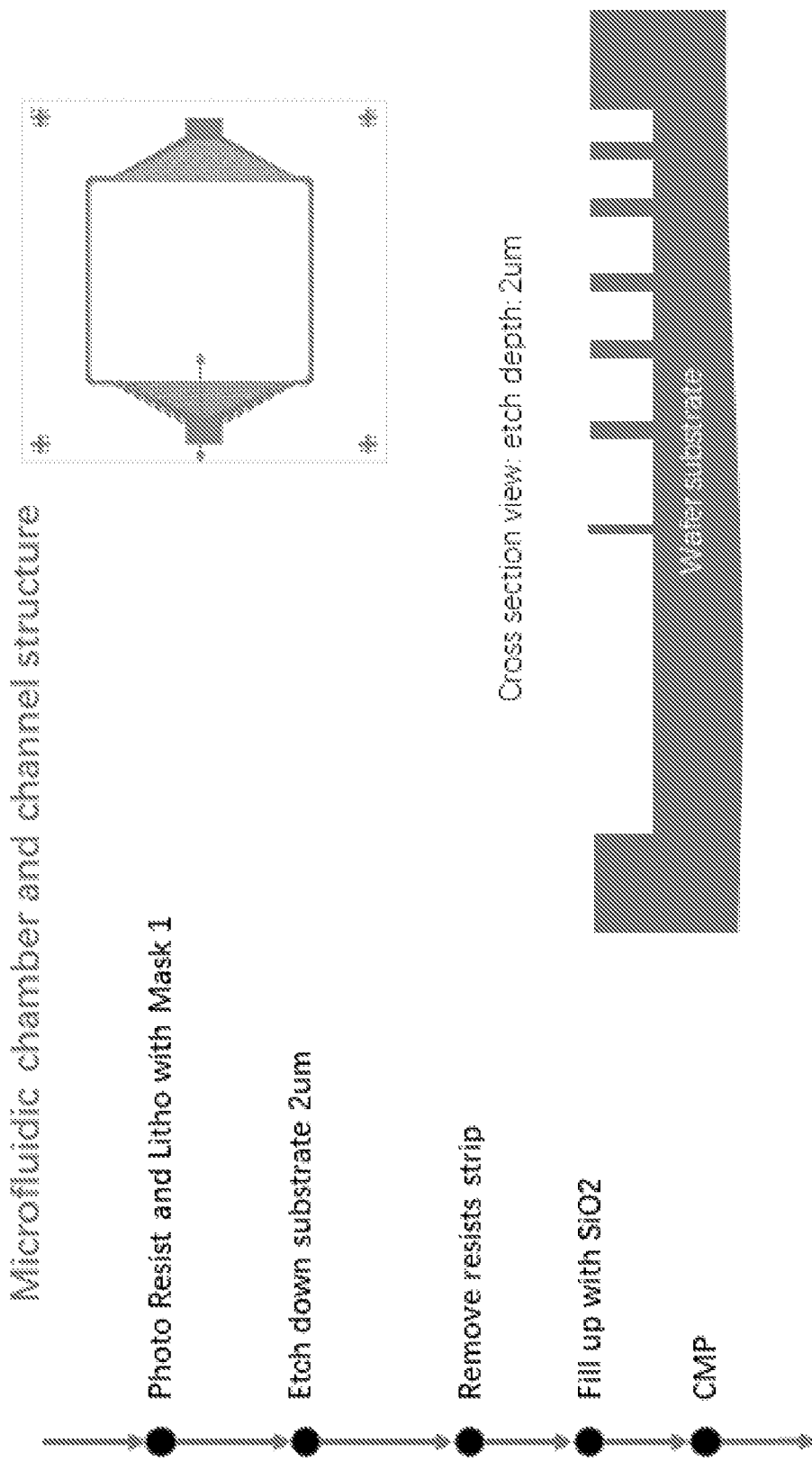
FIG. 28 schematically illustrates the fabrication process of microfluidic chamber and channel structure in a MEMS sample holder in accordance with an exemplary embodiment of the present invention.

FIGS. 28-34 illustrate the detailed processing flow. FIG. 28 schematically illustrates the fabrication process of microfluidic chamber and channel structure in a MEMS sample holder: (1) Photo Resist and Litho with Mask 1; (2) Etch down substrate 2 um; (3) Remove resists strip; (4) Fill up with SiO2; and (5) Chemical mechanical planarization or polishing (CMP).

Figure 29:
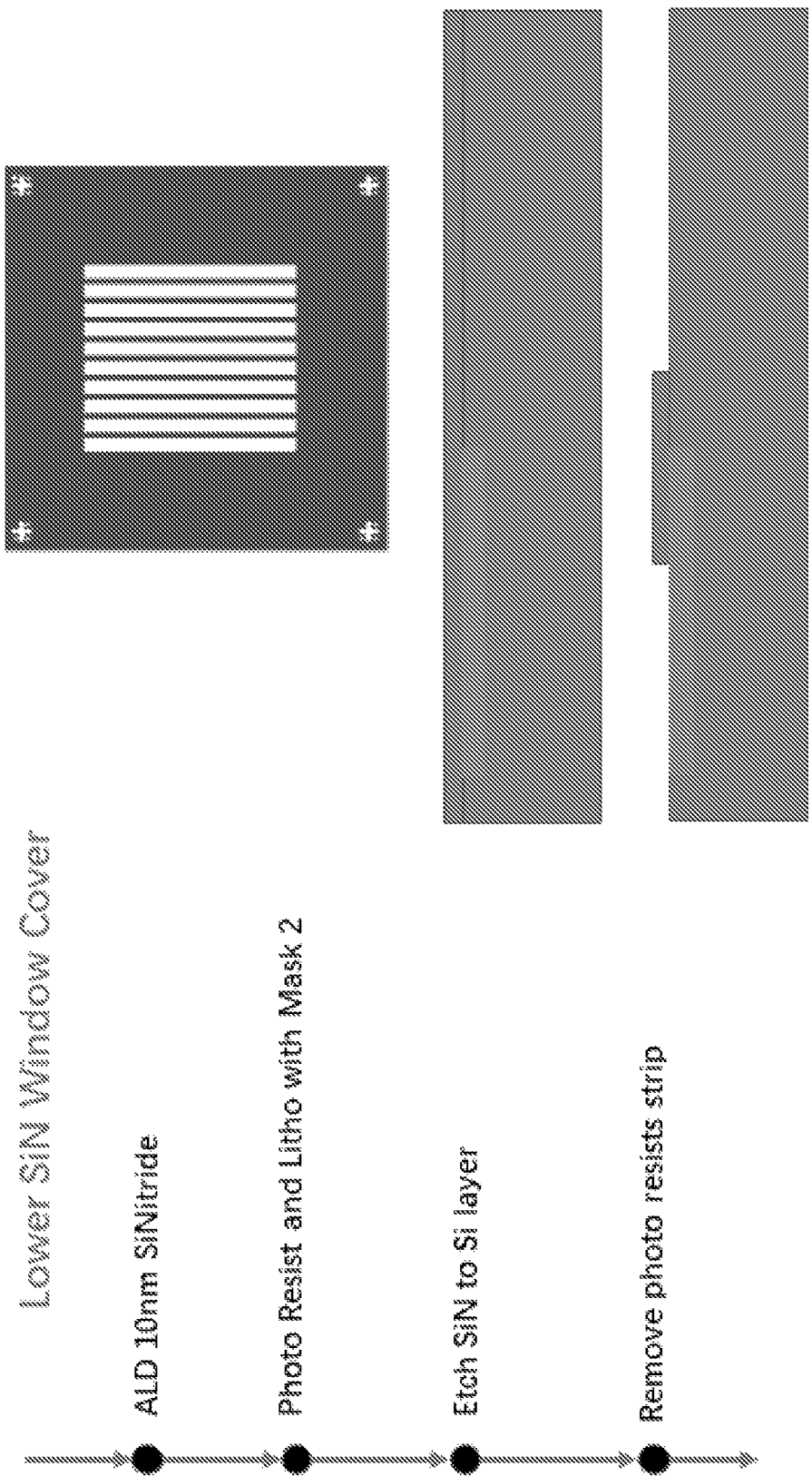
FIG. 29 schematically illustrates the fabrication process Lower SiN Window Cover in a MEMS sample holder in accordance with an exemplary embodiment of the present invention.

FIG. 29 schematically illustrates the fabrication process of Lower SiN Window Cover in a MEMS sample holder: (1) Atomic layer deposition (ALD) of 10 nm Si Nitride; (2) Photo Resist and Litho with Mask 2; (3) Etch SiN to Si layer; and (4) Remove photo resists strip.

Figure 30:
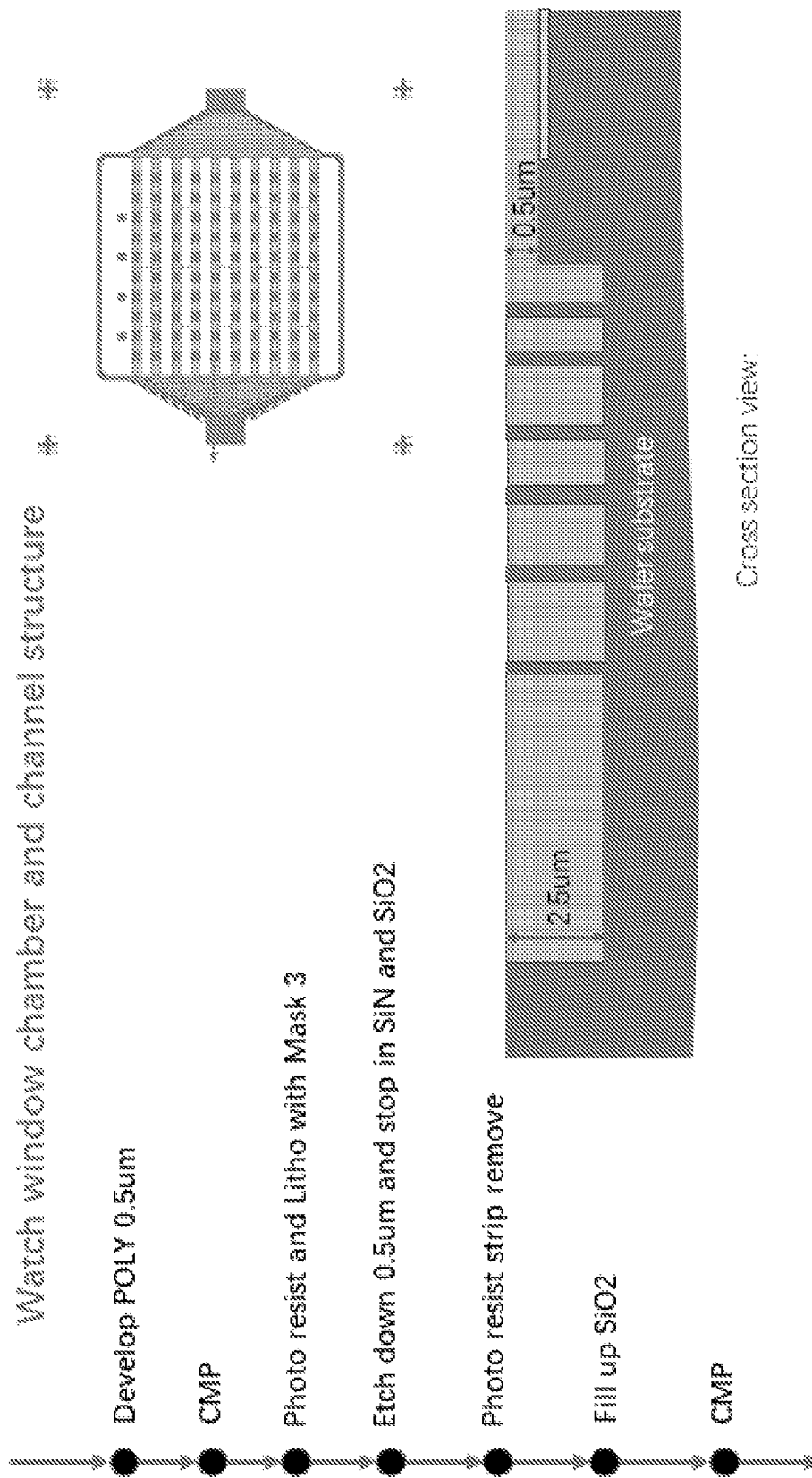
FIG. 30 schematically illustrates the fabrication process of watch window chamber and channel structure in a MEMS sample holder in accordance with an exemplary embodiment of the present invention.

FIG. 30 schematically illustrates the fabrication process of watch window chamber and channel structure in a MEMS sample holder: (1) Develop polycrystalline silicon, semi-crystalline silicon, or polysilicon (POLY) of 0.5 um thick; (2) Chemical mechanical planarization or polishing (CMP); (3) Photo resist and Litho with Mask 3; (4) Etch down 0.5 um and stop in SiN and SiO2; (5) photo resist strip remove; (6) fill up SiO2; and (7) Chemical mechanical planarization or polishing (CMP).

Figure 31:
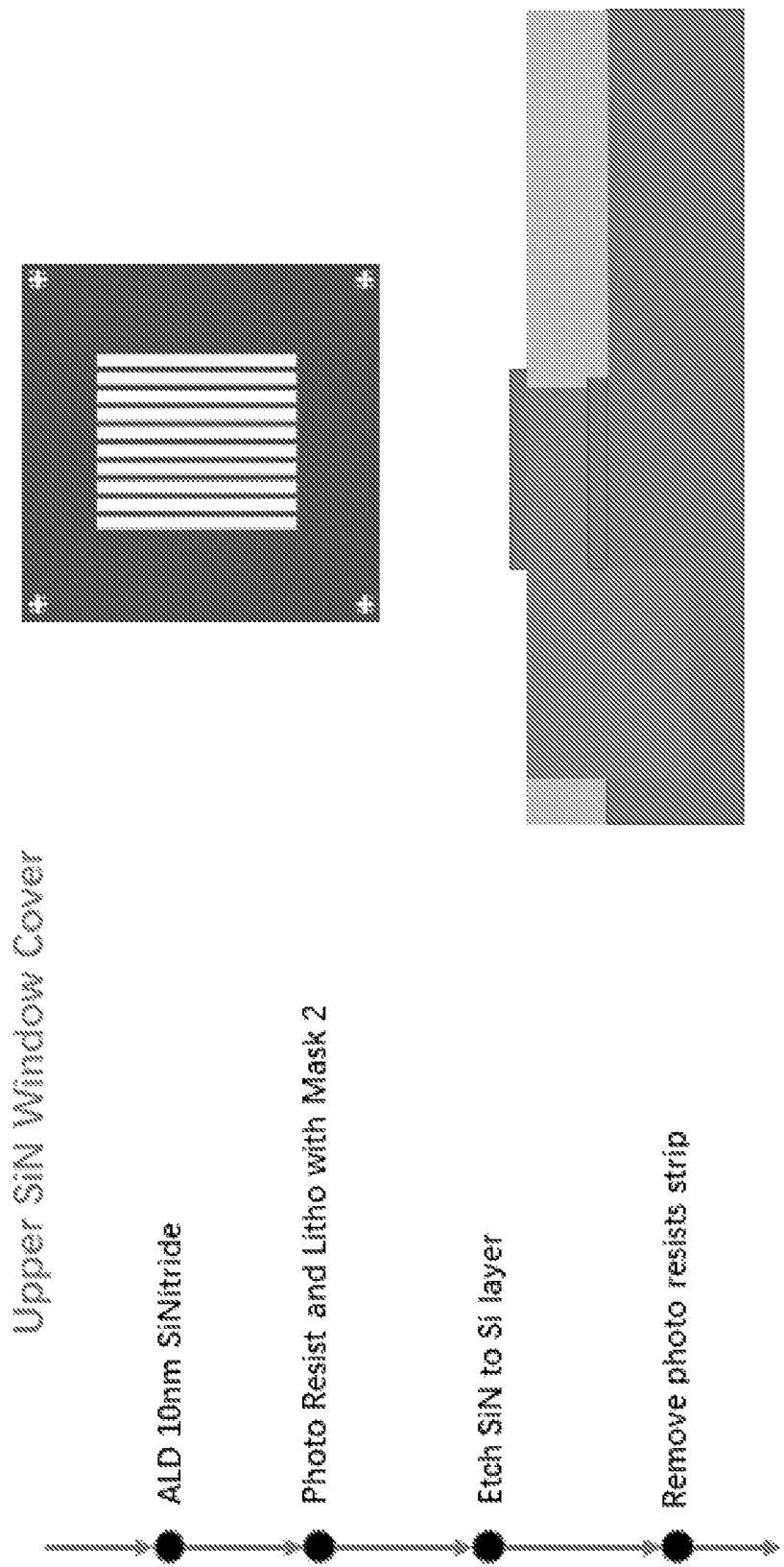
FIG. 31 schematically illustrates the fabrication process of Upper SiN Window Cover in a MEMS sample holder in accordance with an exemplary embodiment of the present invention.

FIG. 31 schematically illustrates the fabrication process of Upper SiN Window Cover in a MEMS sample holder: (1)

Atomic layer deposition (ALD) of 10 nm Si Nitride; (2) Photo Resist and Litho with Mask 2; (3) Etch SiN to Si layer; and (4) Remove photo resists strip.

Figure 32:
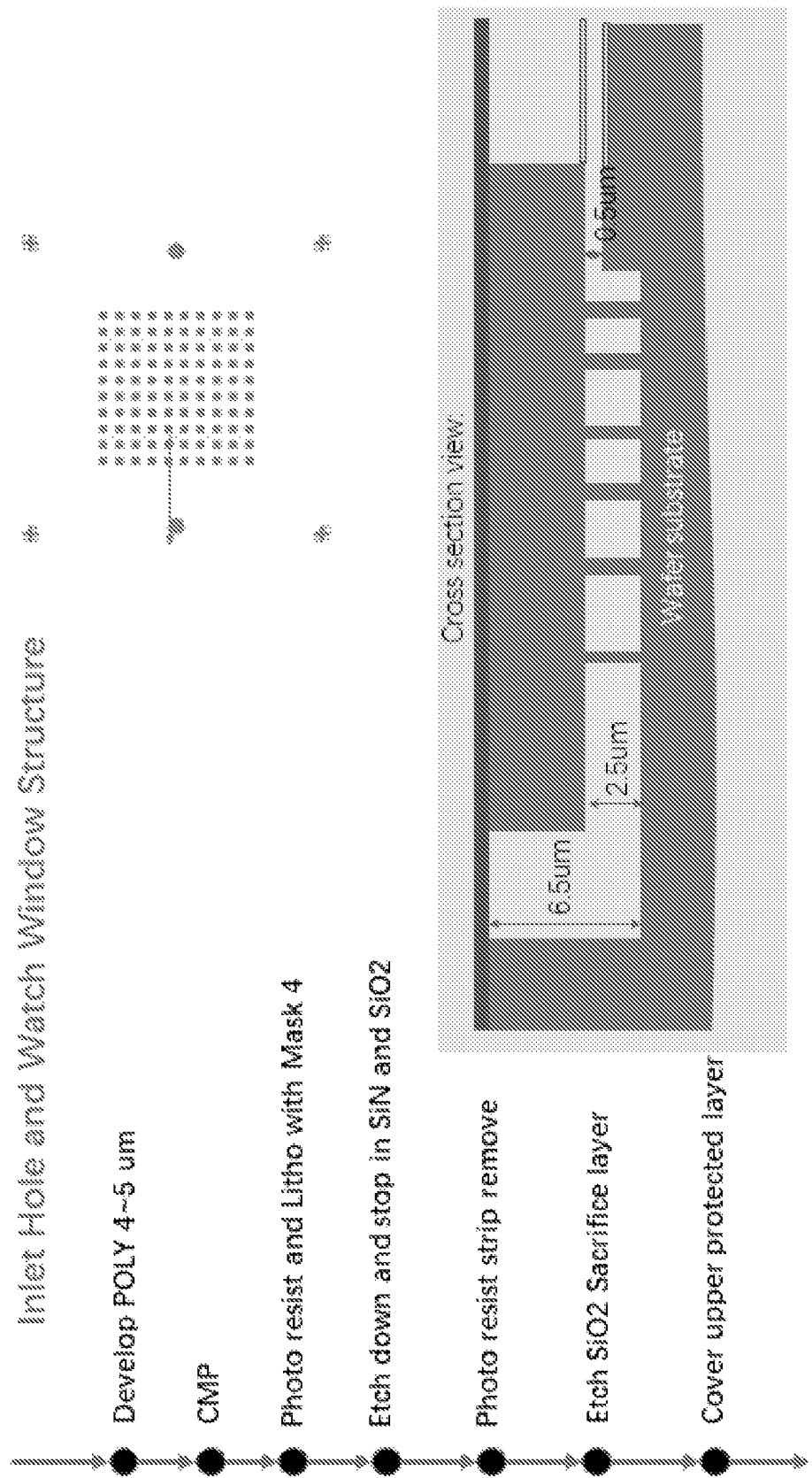
FIG. 32 schematically illustrates the fabrication process of Inlet Hole and Watch Window Structure in a MEMS sample holder in accordance with an exemplary embodiment of the present invention.

FIG. 32 schematically illustrates the fabrication process of Inlet Hole and Watch Window Structure in a MEMS sample holder: (1) Develop POLY 4~5 um; (2) Chemical mechanical planarization or polishing (CMP); (3) Photo resist and Litho with Mask 4; (4) Etch down and stop in SiN and SiO2; (5) Photo resist strip remove; (6) Etch SiO2 Sacrifice layer; and (7) Cover upper protected layer.

Figure 33:
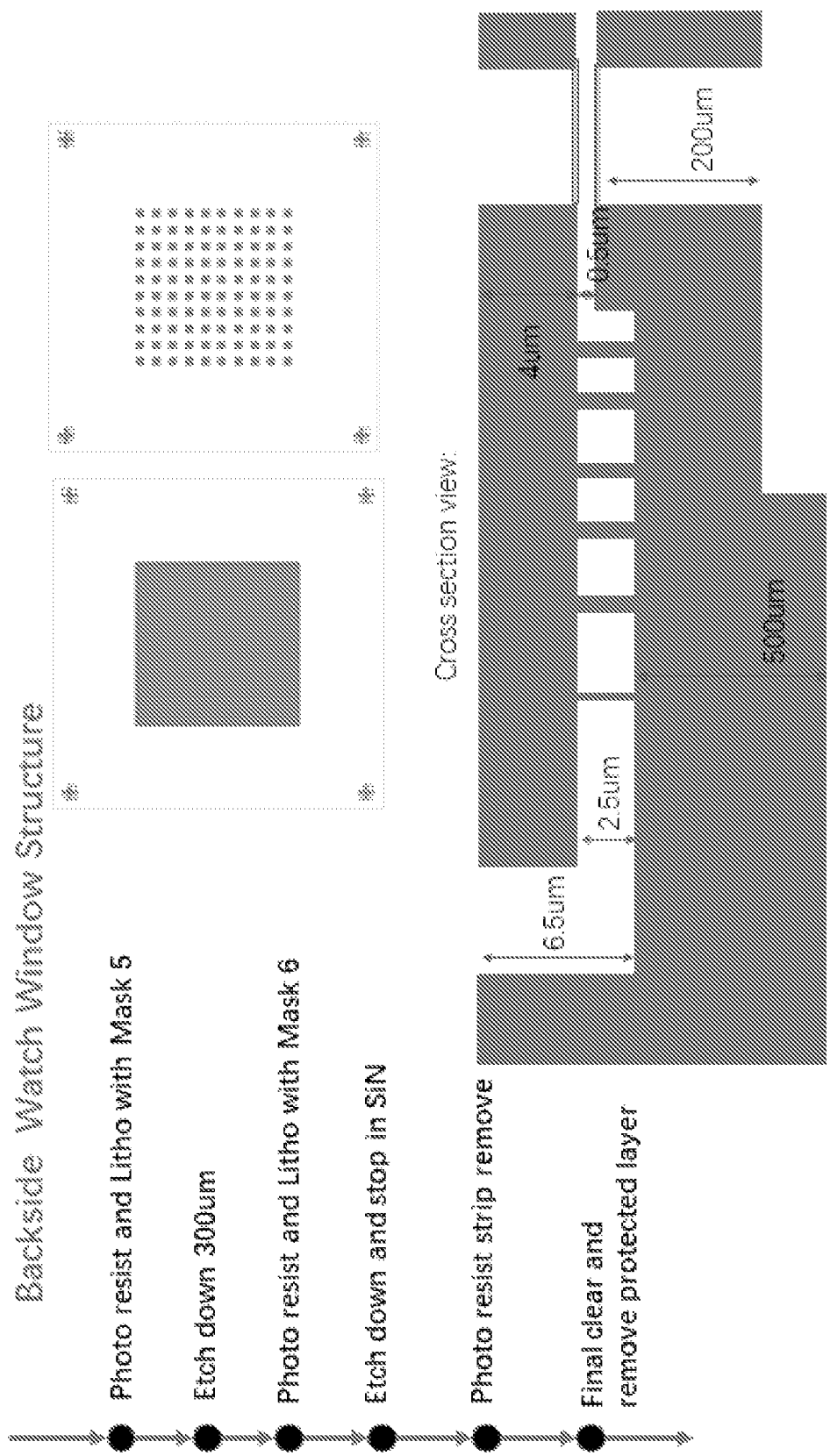
FIG. 33 schematically illustrates the fabrication process of Backside Watch Window Structure in a MEMS sample holder in accordance with an exemplary embodiment of the present invention.
Figure 34:
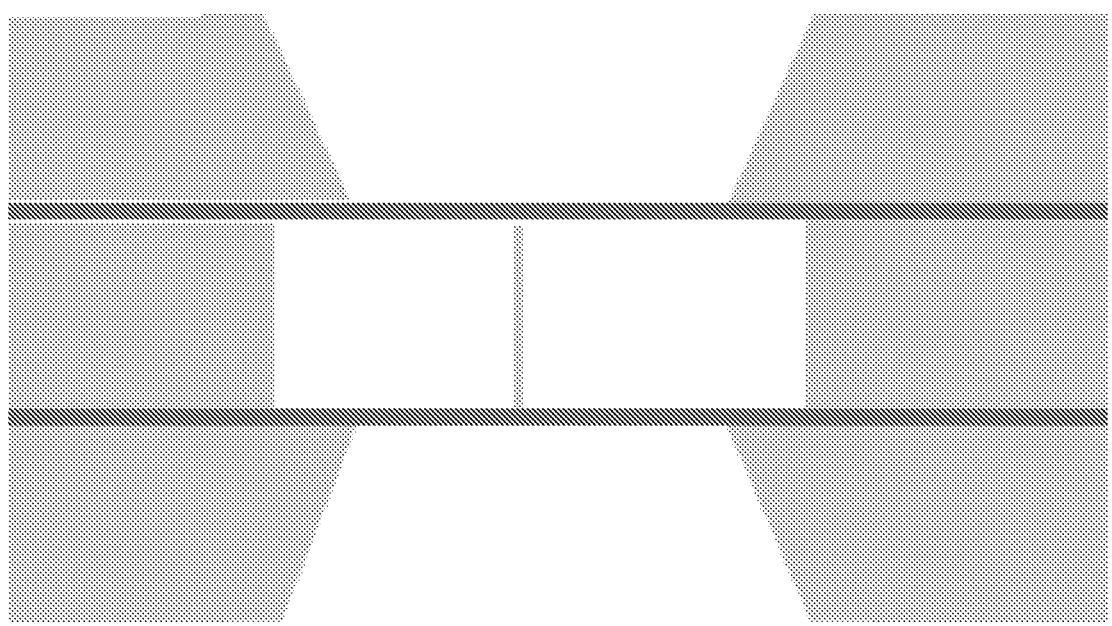
FIG. 34 shows for a STEM Watch Cell Window Ideal Structure in a MEMS sample holder in accordance with an exemplary embodiment of the present invention.

FIG. 33 schematically illustrates the fabrication process of Backside Watch Window Structure in a MEMS sample holder: (1) Photo resist and Litho with Mask 5; (2) Etch down 300 um; (3) Photo resist and Litho with Mask 6; (4) Etch down and stop in SiN; (5) Photo resist strip remove; and (6) Final clear and remove protected layer. FIG. 34 shows for a STEM Watch Cell Window Ideal Structure in a MEMS sample holder. Real layout may round at all corners.

In the foregoing specification, embodiments of the present invention have been described with reference to numerous specific details that may vary from implementation to implementation.

The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. A MEMS sample holder comprising:
an observation section that includes:
a first layer,
a second layer, and
a sample compartment between the first layer and the second layer;
wherein the sample compartment is configured for filling a liquid sample and observing the liquid sample filled therewithin;
wherein the sample compartment has one, two or more windows through which an electron beam can pass,
wherein each of the windows is formed on two cavities including a first cavity on the first layer and a second cavity on the second layer that is opposite to the first cavity across the sample compartment,
wherein the MEMS sample holder further comprises a sample inlet and a sample outlet, wherein the MEMS sample holder is configured for a liquid sample to flow into the sample compartment through the sample inlet and exit the sample compartment through the sample outlet, and
wherein the MEMS sample holder further comprises a filter between the sample inlet and the observation section configured for filtering the liquid sample before the sample flows into the sample compartment.

2. The MEMS sample holder according to claim 1, wherein the filter is a filter section that is defined between the first layer and the second layer.

3. The MEMS sample holder according to claim 2, comprising:
a first filter section between the sample inlet and the observation section and
a second filter section between the sample outlet and the observation section;
wherein both filter sections are defined between the first layer and the second layer and configured for filtering the liquid sample before the sample flows into the sample compartment, so that the sample inlet can alternatively be used as a sample outlet while the sample outlet can alternatively be used as a sample inlet.

4. The MEMS sample holder according to claim 2, further comprising one, two or more circumventing tunnels that bypass the observation section and the filter section;
wherein the circumventing tunnel(s) is/are configured for particles in the sample that are too large to pass through the filter section, to travel directly from the inlet to the outlet.

5. The MEMS sample holder according to claim 2, wherein the filter section comprises multiple pillars connecting the first layer and the second layer, and
wherein a gap between two neighboring pillars functions as a filter mesh allowing particles of a certain size or smaller to pass through.

6. The MEMS sample holder according to claim 1, further comprising one or more support columns within the sample compartment,
wherein the one or more support columns connect a thin bottom layer of a first cavity of a window and a thin bottom layer of a second cavity of said window; and
wherein the one or more support columns protect the two thin bottom layers from breaking or collapsing.

7. The MEMS sample holder according to claim 1, wherein two or more of the cavities on the first/second layer are merged into a trench-shaped common cavity.

8. The MEMS sample holder according to claim 1, wherein the windows are arranged in a M×N matrix or array, M≥2, and N≥2.

9. The MEMS sample holder according to claim 1, wherein the sample compartment is divided into M≥2 separate sample tunnels, each of which is configured for a liquid sample to flow from one end of the sample tunnel to another end.

10. The MEMS sample holder according to claim 9, wherein N≥2 separate windows are formed on each of the M≥2 separate sample tunnels along the longitudinal direction of each sample tunnel.

11. The MEMS sample holder according to claim 10, wherein two or more cavities outside different sample channels are merged into one trench-shaped common cavity on the first/second layer.

12. The MEMS sample holder according to claim 10, wherein all M≥2 cavities in a row outside M≥2 different sample channels are merged into one trench-shaped common cavity on the first/second layer.

13. The MEMS sample holder according to claim 10, wherein M≥2 cavities in each of N≥2 rows and outside M≥2 different sample channels are merged into one trench-shaped common cavity on the first/second layer, forming windows in a M×N matrix or array.

14. The MEMS sample holder according to claim 11, wherein the M≥2 sample tunnels are in parallel with each other; N≥2 trenches are in parallel with each other; and the M≥2 sample tunnels are perpendicular to the N≥2 trenches.

15. The MEMS sample holder according to claim 1, wherein bottom layers of the first cavity and the second cavity are made of SiN with a thickness of 5 nm-10 nm; or
wherein the MEMS sample holder has a size of 3×3 mm, and is used in a TEM/STEM; wherein the observation section has a size of 2 mm×2 mm with windows each has a size of 100 um×100 um; and wherein a thickness/height of the sample compartment at the windows is from 100 nm to 500 nm.

16. A MEMS sample holder comprising:
an observation section that includes:
a first layer,
a second layer, and
a sample compartment between the first layer and the second layer;
wherein the sample compartment is configured for filling a liquid sample and observing the liquid sample filled therewithin;
wherein the sample compartment has one, two or more windows through which an electron beam can pass,
wherein each of the windows is formed on two cavities including a first cavity on the first layer and a second cavity on the second layer that is opposite to the first cavity across the sample compartment, and
wherein one of the first & second layers comprises a SiN sub-layer and a substrate sub-layer, and another one comprises a SiN sub-layer and a polysilicone sub-layer; and wherein bottom layers of the first cavity and the second cavity are made of SiN with a thickness of 5 nm-10 nm, and the substrate sub-layer and the polysilicone sub-layer have been etched away from all the cavities.

17. A packaged MEMS device, comprising the MEMS sample holder according to claim 1 and glass members coated with a metal layer.

18. An apparatus of charged-particle beam comprising the packaged MEMS device according to claim 17.

\* \* \* \* \*